(12) United States Patent
Yamamoto

(10) Patent No.: US 11,189,530 B2
(45) Date of Patent: Nov. 30, 2021

(54) MANUFACTURING METHOD OF CHIPS

(71) Applicant: DISCO CORPORATION, Tokyo (JP)

(72) Inventor: Naoko Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 17 days.

(21) Appl. No.: 16/842,235

(22) Filed: Apr. 7, 2020

(65) Prior Publication Data

US 2020/0335396 A1 Oct. 22, 2020

(30) Foreign Application Priority Data

Apr. 19, 2019 (JP) .............................. JP2019-079924

(51) Int. Cl.

| | |
|---|---|
| *H01L 21/78* | (2006.01) |
| *H01L 21/683* | (2006.01) |
| *H01L 23/544* | (2006.01) |
| *H01L 21/67* | (2006.01) |
| *H01L 21/68* | (2006.01) |
| *H01L 29/16* | (2006.01) |

(52) U.S. Cl.
CPC ........ *H01L 21/78* (2013.01); *H01L 21/67092* (2013.01); *H01L 21/681* (2013.01); *H01L 21/6836* (2013.01); *H01L 23/544* (2013.01); *H01L 29/1608* (2013.01); *H01L 2221/68327* (2013.01); *H01L 2223/5446* (2013.01)

(58) Field of Classification Search
CPC ........... H01L 21/6838; H01L 21/67132; H01L 2221/6834
See application file for complete search history.

(56) References Cited

U.S. PATENT DOCUMENTS

| | | | |
|---|---|---|---|
| 2007/0105345 A1 | 5/2007 | Kurosawa | |
| 2008/0305583 A1 | 12/2008 | Inada et al. | |
| 2014/0073067 A1 | 3/2014 | Uchida | |
| 2014/0360671 A1* | 12/2014 | Hwang | ................... B32B 38/18 |
| | | | 156/363 |

FOREIGN PATENT DOCUMENTS

| | | |
|---|---|---|
| JP | 2002192370 A | 7/2002 |
| JP | 2005260154 A | 9/2005 |

(Continued)

OTHER PUBLICATIONS

Search Report issued in counterpart Singapore patent application No. 10202003054X, dated Dec. 7, 2020.

*Primary Examiner* — Moazzam Hossain
*Assistant Examiner* — Stanetta D Isaac
(74) *Attorney, Agent, or Firm* — Greer Burns & Crain, Ltd.

(57) ABSTRACT

A manufacturing method of chips from a workpiece including plural planned dividing lines on a front surface includes a cutting step of causing a cutting blade to cut into the workpiece for which a side of the front surface of the workpiece is held by a holding table in such a manner that a side of a back surface of the workpiece is exposed and forming a cut groove that does not reach the front surface of the workpiece on the side of the back surface of the workpiece along each planned dividing line, a sticking step of sticking an expanding sheet to the workpiece, and a dividing step of dividing the workpiece along each planned dividing line by expanding the expanding sheet to form the chips from the workpiece after the sticking step and the cutting step.

12 Claims, 16 Drawing Sheets

(56) References Cited

FOREIGN PATENT DOCUMENTS

| | | | |
|---|---|---|---|
| JP | 2011222698 | A | 11/2011 |
| JP | 2013214600 | A | 10/2013 |
| JP | 2014179434 | A | 9/2014 |
| JP | 2019016634 | A | 1/2019 |
| JP | 2019212772 | A | 12/2019 |
| JP | 2020027872 | A | 2/2020 |
| WO | 2006073098 | A1 | 7/2006 |

* cited by examiner

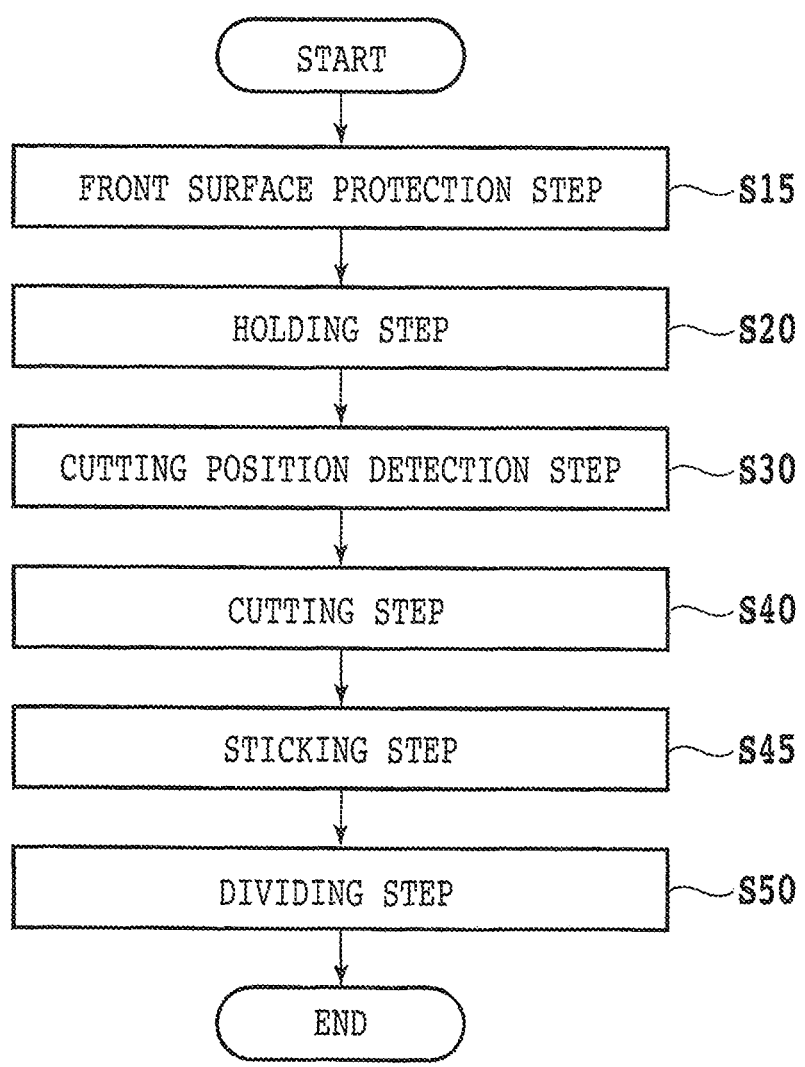

MANUFACTURING METHOD OF CHIPS

BACKGROUND OF THE INVENTION

Field of the Invention

The present invention relates to a manufacturing method of chips in which a workpiece having plural planned dividing lines on a front surface is divided along each planned dividing line to manufacture chips from the workpiece.

Description of the Related Art

In electronic equipment typified by mobile phones and personal computers, a device chip having a device such as an electronic circuit is used. The device chip is manufactured by segmenting the front surface side of a wafer formed of a semiconductor material such as silicon into plural regions by planned dividing lines (streets) and forming a device in each region and thereafter dividing the wafer along these planned dividing lines for example. When a plate-shaped workpiece typified by the wafer is divided into small pieces such as device chips, a laser processing apparatus is used for example. Specifically, a method has been proposed in which a modified layer is formed inside a workpiece through carrying out irradiation with a laser beam along planned dividing lines of the workpiece in such a manner that the focal point of the laser beam having such a wavelength as to be transmitted through the workpiece is positioned inside the workpiece and thereafter giving an external force to the workpiece to divide the workpiece (for example refer to Japanese Patent No. 3408805).

However, when the workpiece is comparatively thick, plural modified layers need to be formed in the thickness direction of the workpiece and thereafter the external force needs to be given to each street by using a breaking apparatus. Therefore, it takes a long time to divide the workpiece in some cases. Furthermore, also when the size of the designed device chip is comparatively small, it takes a long time to divide the workpiece in some cases. Incidentally, the workpiece is divided by using a cutting apparatus instead of the laser processing apparatus in some cases. The cutting apparatus includes a spindle that serves as a rotation axis and a ring-shaped abrasive tool called a cutting blade is mounted to this spindle. By causing the cutting blade to cut into the workpiece along the planned dividing lines while rotating the cutting blade at high speed, the workpiece is cut from the back surface to the front surface to be divided into plural device chips.

SUMMARY OF THE INVENTION

However, in the case of dividing the workpiece by using the cutting blade, the width of the planned dividing line needs to be set in advance in consideration of the width of a cut groove (i.e. kerf width) formed in the workpiece by the cutting and the size of chipping that occurs due to the cutting. In particular, when devices are formed on the front surface side of the workpiece, the width of the planned dividing lines, layout of the devices, and so forth need to be designed in consideration of the kerf width formed on the front surface side. The width of the planned dividing lines affects the number of chips obtained per one workpiece for example. When the width of the planned dividing lines is larger, the number of chips obtained per one workpiece becomes smaller. Therefore, to increase the number of chips obtained per one workpiece, the width of the planned dividing lines needs to be made smaller. The present invention is made in view of this problem and intends to provide a manufacturing method of chips with which the kerf width can be made small even in the case of using a cutting apparatus.

In accordance with an aspect of the present invention, there is provided a manufacturing method of chips in which a workpiece including a plurality of planned dividing lines on a front surface is divided along each planned dividing line to manufacture the chips from the workpiece. The manufacturing method of chips includes a cutting step of causing a cutting blade to cut into the workpiece for which the side of the front surface of the workpiece is held by a holding table in such a manner that the side of a back surface of the workpiece is exposed and forming a cut groove that does not reach the front surface of the workpiece on the side of the back surface of the workpiece along each planned dividing line, a sticking step of sticking an expanding sheet to the workpiece, and a dividing step of dividing the workpiece along each planned dividing line by expanding the expanding sheet to form the chips from the workpiece after the sticking step and the cutting step.

Preferably, the manufacturing method of chips further includes a cutting position detection step of imaging the front surface of the workpiece by an infrared camera from the side of the back surface of the workpiece and detecting at least one planned dividing line before the cutting step. Furthermore, preferably, the holding table has a holding member that is at least partly transparent from a front surface of the holding member to a back surface of the holding member, and the manufacturing method of chips further includes a cutting position detection step of imaging the front surface of the workpiece by a camera for visible light through the holding member and detecting at least one planned dividing line before the cutting step.

Moreover, preferably, the workpiece includes a silicon carbide substrate and a metal layer that is disposed on one surface of the silicon carbide substrate and is located on the side of the back surface of the workpiece, and the cutting blade is caused to cut into the workpiece from the side of the back surface of the workpiece to form the cut grooves in the cutting step. In addition, preferably, the sticking step is carried out before the cutting step, the expanding sheet is stuck to the side of the front surface of the workpiece in the sticking step, and the cut grooves are formed in the workpiece in a state in which the side of the front surface of the workpiece is held by the holding table with the intermediary of the expanding sheet in the cutting step.

Furthermore, preferably, the sticking step is carried out after the cutting step, and the expanding sheet is stuck to the side of the back surface of the workpiece in the sticking step. Moreover, preferably, the cutting blade has a pair of inclined surfaces or a curved surface at an outer circumferential part, and the workpiece is cut by the cutting blade in the cutting step. In addition, preferably, the workpiece has a circuit layer including insulating layers and interconnect layers that are alternately stacked on the side of the front surface, and the cut grooves that do not reach the circuit layer are formed in the workpiece in the cutting step.

In the cutting step according to one aspect of the present invention, the cut groove that does not reach the front surface of the workpiece is formed along each planned dividing line. Moreover, in the sticking step, the expanding sheet is stuck to the workpiece. Then, in the dividing step, after the sticking step and the cutting step, the workpiece is divided along each planned dividing line by expanding the expanding sheet and the chips are formed from the workpiece. As above, the workpiece is divided without cutting the front surface of the workpiece in the cutting step. Therefore, the kerf width of the side of the front surface can be made smaller than the case of breaking the workpiece from the front surface to the back surface in the cutting step. For this reason, the width of the planned dividing lines can be made small.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 9 is a flowchart of a manufacturing method of chips in a second embodiment.

DETAILED DESCRIPTION OF THE PREFERRED EMBODIMENTS

Figure 1A:
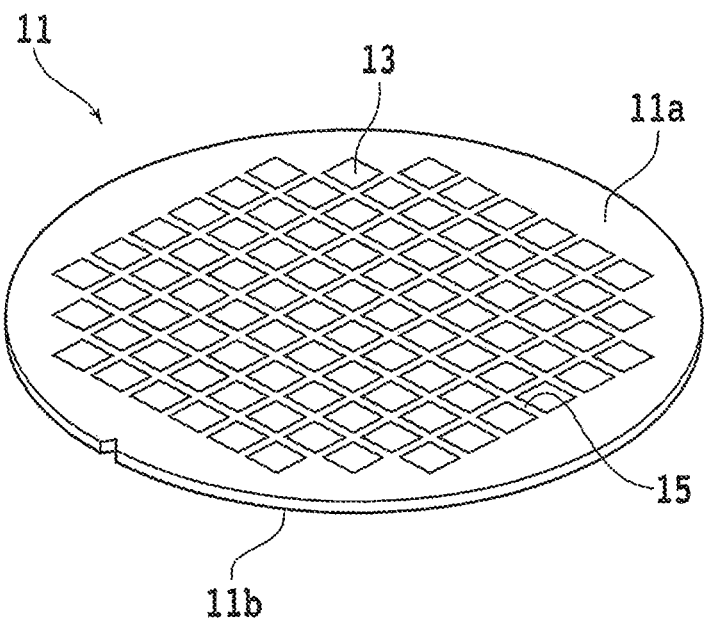
FIG. 1A is a perspective view of a workpiece.

Embodiments according to one aspect of the present invention will be described with reference to the accompanying drawings. First, a configuration example of a workpiece 11 will be described. FIG. 1A is a perspective view of the workpiece 11. The workpiece 11 has a substantially circular disc shape and includes a front surface 11a and a back surface 11b. The workpiece 11 has a substrate 11c (see FIG. 5A and so forth) formed of silicon (Si). On the side of the front surface 11a of the workpiece 11, a circuit layer 11d (see FIG. 5A and so forth) is formed in contact with the substrate 11c. The circuit layer 11d includes low-dielectric-contact insulator layers (what is generally called Low-k material layers) and interconnect layers that are alternately stacked.

The side of the front surface 11a of the workpiece 11 is segmented into plural regions by plural planned dividing lines (streets) 15 arranged in a lattice manner to intersect each other. In each of the plural regions, a device 13 such as an integrated circuit (IC), a large scale integration (LSI), and a light emitting diode (LED) is formed. Each device 13 is composed of the above-described substrate 11c and circuit layer 11d. There is no limit to the material, shape, structure, size, and so forth of the substrate 11c. For example, the substrate 11c may be formed of a material such as another semiconductor (GaAs, InP, GaN, or the like), sapphire, glass, ceramic, resin, or multiple oxide ($LiNbO_3$, $LiTaO_3$). Furthermore, there is no limit also to the kind, quantity, shape, structure, size, arrangement, and so forth of the devices 13.

Figure 1B:
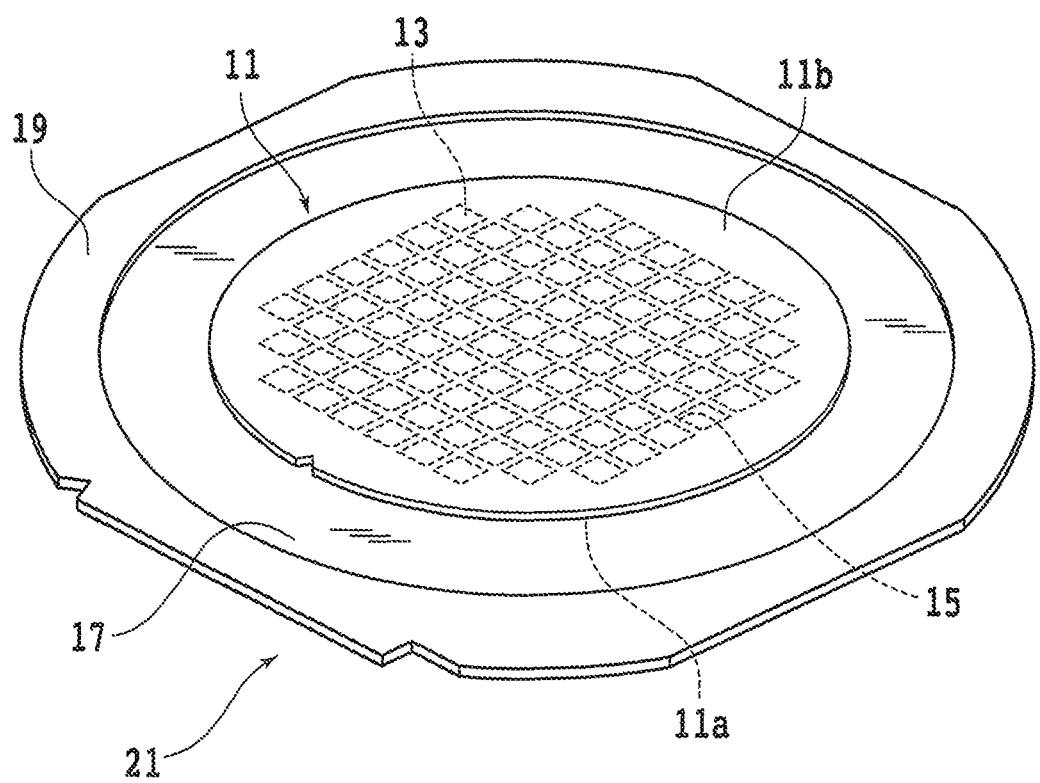
FIG. 1B is a perspective view of a workpiece unit.

When the workpiece 11 is processed, first, the workpiece 11 and a ring-shaped frame 19 made of a metal are integrated to form a workpiece unit 21 by a circular dicing tape 17 formed of a material such as a resin. FIG. 1B is a perspective view of the workpiece unit 21. The ring-shaped frame 19 has a circular opening part larger than the diameter of the workpiece 11 and the workpiece 11 is disposed in this opening part. The dicing tape 17 bonds to the side of the front surface 11a of the workpiece 11 and one surface of the ring-shaped frame 19.

The dicing tape 17 has a diameter larger than the opening of the ring-shaped frame 19. The dicing tape 17 is an expanding sheet having expandability and can be easily deformed in response to a tensile stress. The dicing tape 17 is a film that is made of a resin and is obtained by stacking a glue layer (adhesion layer) on a base layer formed of the resin for example. The base layer is formed of a resin such as polyolefin (PO), polyvinyl chloride (PVC), or polyethylene terephthalate (PET) and the adhesion layer is formed of a resin such as a rubber-based resin, acrylic resin, or silicone-based resin.

The adhesion layer is an ultraviolet-curable resin for example and is disposed on the whole of one surface of the base layer. The ultraviolet-curable resin has a strong adhesion force before being irradiated with ultraviolet but the adhesion force lowers when the resin is irradiated with ultraviolet (UV). For example, when the adhesion layer is irradiated with ultraviolet through a base layer through which the ultraviolet can be transmitted, the workpiece 11 can be easily removed from the dicing tape 17. By processing and dividing the workpiece 11 along each planned dividing line 15, plural chips 23 (see FIG. 7), i.e. device chips, each having the device 13 are manufactured. Various methods can be used for the processing of the workpiece 11. For example, a cutting apparatus 2 that cuts the workpiece 11 along the planned dividing lines 15 by a cutting blade is used.

Figure 2:
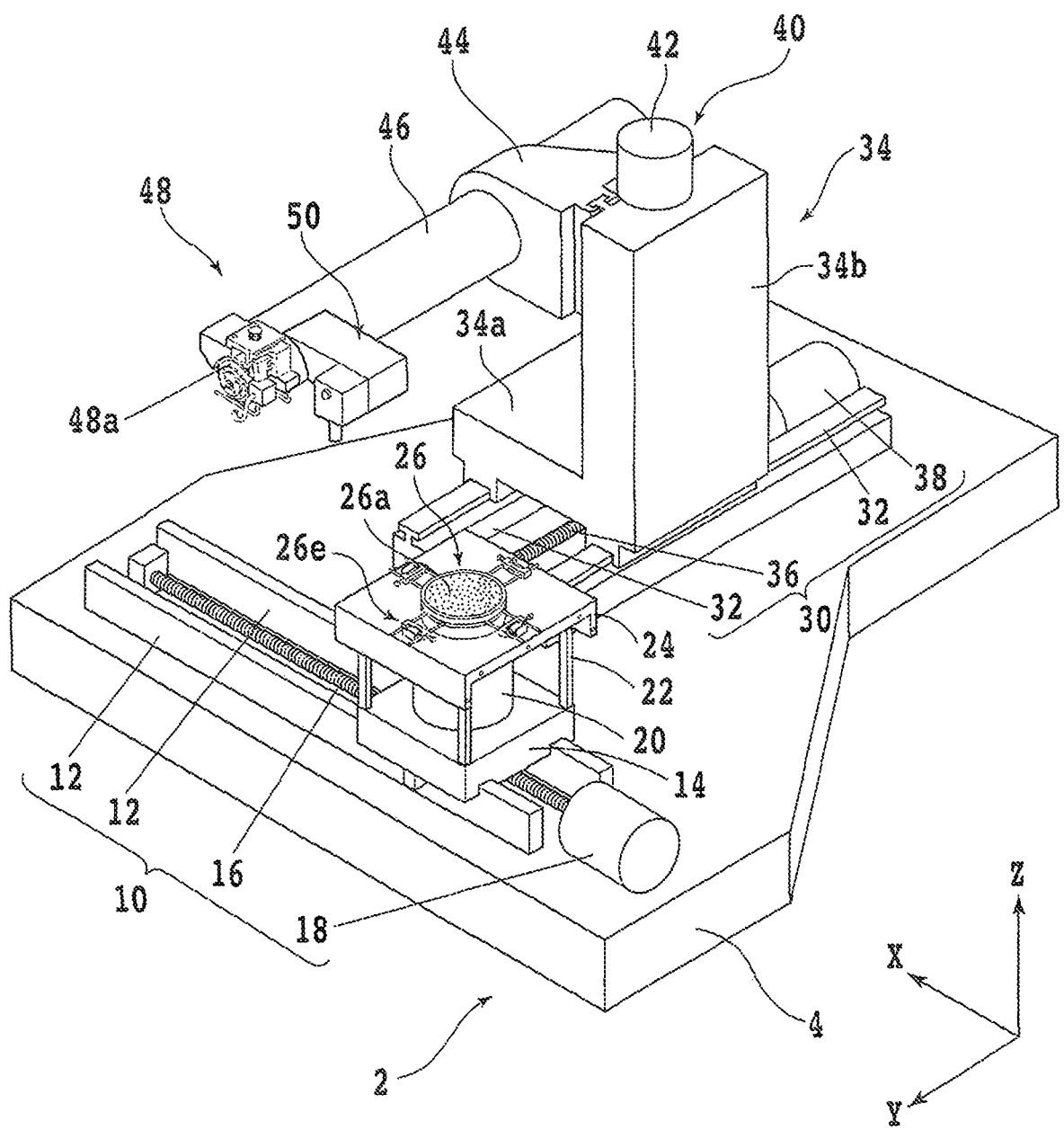
FIG. 2 is a perspective view of a cutting apparatus.

FIG. 2 is a perspective view of the cutting apparatus 2. X-axis direction (processing feed direction), Y-axis direction (indexing feed direction), and Z-axis direction (height direction, cutting-in feed direction) used in the following description are perpendicular to each other. The cutting apparatus 2 includes a base 4 that supports the respective structures. An X-axis movement unit 10 is disposed on part of the upper surface of the base 4. The X-axis movement unit 10 has a pair of X-axis guide rails 12 parallel to the X-axis direction. Each X-axis guide rail 12 is fixed to the upper surface of the base 4.

An X-axis movement table 14 is slidably attached to each X-axis guide rail 12. A nut part (not depicted) is disposed on the back surface side (lower surface side) of the X-axis movement table 14 and an X-axis ball screw 16 disposed in parallel to the X-axis guide rails 12 is joined to this nut part in a rotatable form. An X-axis pulse motor 18 is coupled to one end of the X-axis ball screw 16. When the X-axis ball screw 16 is rotated by the X-axis pulse motor 18, the X-axis movement table 14 moves in the X-axis direction along the X-axis guide rails 12.

A support pedestal 20 with a cylindrical shape is disposed at substantially the center of the upper surface side of the X-axis movement table 14. Furthermore, four support columns 22 with a prismatic column shape are fixed to four corners of the upper surface side of the X-axis movement table 14 and a table cover 24 with a rectangular shape is fixed to the upper side of the support columns 22. A chuck table (holding table) 26 for sucking and holding the workpiece 11 is disposed on the upper surface side of the table cover 24. Here, the structure of the chuck table 26 will be described with reference to FIG. 3A.

The chuck table 26 has a frame body 26b that is composed of a metal material such as stainless steel and has a cylindrical shape. A recess part with a substantially circular disc shape is formed at the upper part of the frame body 26b. At the bottom part of this recess part, plural bottom flow paths $26c_1$ each formed in a straight line manner along the radial direction of the recess part are formed. Furthermore, at the central part of the bottom part of the recess part, a central flow path $26c_2$ that penetrates the frame body 26b from the bottom part of the recess part to the back surface of the frame body 26b is formed. A holding member 26d with a circular disc shape is fitted into the recess part of the frame body 26b and the holding member 26d is fixed to the recess part by an adhesive or the like. The holding member 26d is a porous plate formed of a porous member such as porous ceramic and is connected to a suction source 28a including an ejector or the like through the bottom flow paths $26c_1$ and the central flow path $26c_2$.

A valve 28b is disposed between the central flow path $26c_2$ and the suction source 28a. By setting the valve 28b to the open state, a suction force is generated at the front surface of the holding member 26d (i.e. holding surface 26a). Four clamp units 26e for fixing the ring-shaped frame 19 from four sides are disposed around the chuck table 26. The chuck table 26 is coupled to a rotational drive source (not depicted) such as a motor disposed in the support pedestal 20 and rotates around a rotation axis substantially parallel to the Z-axis direction for example.

Here, referring back to FIG. 2 again, the description of the cutting apparatus 2 will be continued. A Y-axis movement unit 30 is disposed at another part of the upper surface of the base 4 different from the X-axis movement unit 10. The Y-axis movement unit 30 has a pair of Y-axis guide rails 32 parallel to the Y-axis direction. Each Y-axis guide rail 32 is fixed to the upper surface of the base 4. A Y-axis movement block 34 is disposed on the pair of Y-axis guide rails 32. The Y-axis movement block 34 has a plate-shaped horizontal plate 34a parallel to the X-axis and Y-axis directions. The bottom surface side of the horizontal plate 34a is slidably attached to each Y-axis guide rail 32.

A nut part (not depicted) is disposed on the lower surface side of the horizontal plate 34a and a Y-axis ball screw 36 disposed in parallel to the Y-axis guide rails 32 is joined to this nut part in a rotatable form. A Y-axis pulse motor 38 is coupled to one end of the Y-axis ball screw 36. When the Y-axis ball screw 36 is rotated by the Y-axis pulse motor 38, the horizontal plate 34a moves in the Y-axis direction along the Y-axis guide rails 32.

A plate-shaped perpendicular plate 34b parallel to the Y-axis and Z-axis directions is fixed to one end of the horizontal plate 34a in the X-axis direction. A Z-axis movement unit 40 is disposed on the surface of the perpendicular plate 34b on the other end side located on the opposite side to the one end of the horizontal plate 34a in the X-axis direction. The Z-axis movement unit 40 has a pair of Z-axis guide rails (not depicted) parallel to the Z-axis direction. Each Z-axis guide rail is fixed to the surface of the perpendicular plate 34b on the other end side in the X-axis direction. A holder 44 that fixes a cutting unit 48 is slidably attached to the pair of Z-axis guide rails.

A nut part (not depicted) is disposed on the back surface side (i.e. side of the perpendicular plate 34b) of the holder 44 and a Z-axis ball screw (not depicted) disposed in parallel to the Z-axis guide rails is joined to this nut part in a rotatable form. A Z-axis pulse motor 42 is coupled to one end of the Z-axis ball screw. When the Z-axis ball screw is rotated by the Z-axis pulse motor 42, the holder 44 moves in the Z-axis direction along the Z-axis guide rails. The holder 44 has a cavity part with a circular column shape. The holder 44 is disposed in such a manner that the height direction of the cavity part with the circular column shape is parallel to the Y-axis direction. A spindle housing 46 configuring the cutting unit 48 is fixed to this cavity part. The spindle housing 46 has a cylindrical shape and is fixed to the cavity part of the holder 44.

The cutting unit 48 has a spindle (not depicted) that serves as a rotation axis parallel to the Y-axis direction. The spindle is partly housed in the spindle housing 46 in a rotatable form. However, one end side of the spindle is exposed from the spindle housing 46. A cutting blade 48a that is obtained by fixing abrasive grains by a binder and has a circular ring shape is mounted to the one end side of the spindle (see FIG. 4A). Meanwhile, a rotational drive source (not depicted) such as a motor is coupled to the other end side of the spindle. When the rotational drive source is driven, the cutting blade 48a rotates with the spindle being the rotation axis.

A nozzle for supplying a cutting liquid such as purified water to the workpiece 11 and the cutting blade 48a is disposed beside the cutting blade 48a. While the cutting liquid is supplied from the nozzle, the rotated cutting blade 48a is caused to cut into the workpiece 11 held by the chuck table 26. Thereby, the workpiece 11 can be cut. At a position adjacent to the cutting unit 48, a camera unit 50 for photographing the workpiece 11 or the like held by the chuck table 26 is disposed. The camera unit 50 is fixed to a lateral side of the spindle housing 46 and moves together with the cutting unit 48 in the Y-axis and Z-axis directions by the Y-axis movement unit 30 and the Z-axis movement unit 40.

The camera unit 50 in a first embodiment has an infrared (IR) camera. The infrared camera includes an objective lens (not depicted) disposed on the side of the holding surface 26a and an imaging element (not depicted) that images a subject through the objective lens. In the cutting apparatus 2, a control unit (not depicted) that controls operation of the X-axis movement unit 10, the chuck table 26, the Y-axis movement unit 30, the Z-axis movement unit 40, the cutting unit 48, the camera unit 50, and so forth is disposed. The control unit is configured by a computer including a processing device such as a central processing unit (CPU) and a storing device such as a flash memory. The processing device is caused to operate in accordance with software such as a program stored in the storing device and thereby the control unit functions as specific means in which the software and the processing device (hardware resources) cooperate.

Figure 3A:
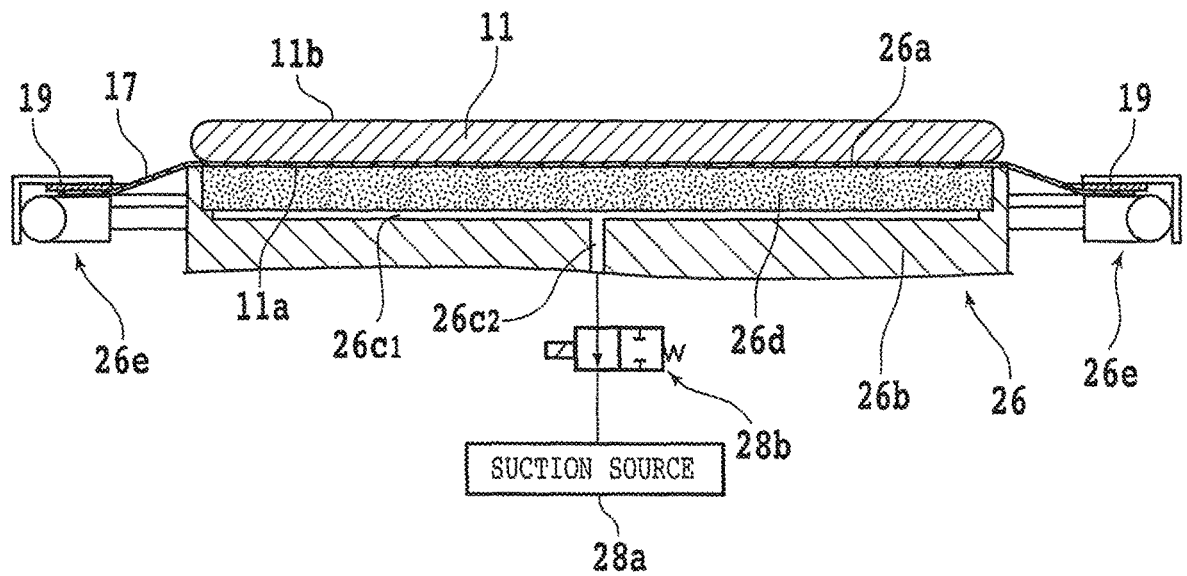
FIG. 3A is a partial sectional side view of a workpiece and so forth in a holding step.

Next, the processing procedure of the workpiece 11 and so forth according to the first embodiment will be described. In the first embodiment, first, as depicted in FIG. 1B, the workpiece 11 is disposed in the opening part of the ring-shaped frame 19 and the dicing tape 17 is stuck to the side of the front surface 11a of the workpiece 11 and one surface of the ring-shaped frame 19 (sticking step (S10)). Thereby, the workpiece unit 21 in which the back surface 11b of the workpiece 11 is exposed is formed. After the sticking step (S10), the side of the dicing tape 17 in the workpiece unit 21 is sucked and held by the chuck table 26 (holding step (S20)). FIG. 3A is a partial sectional side view of the workpiece 11 and so forth in the holding step (S20).

Figure 3B:
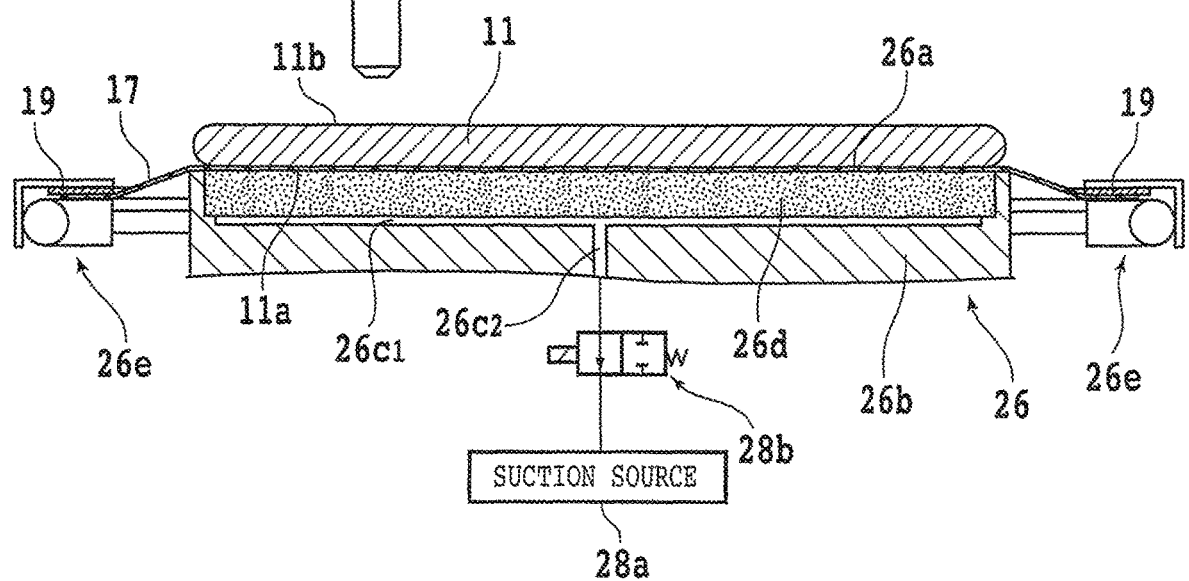
FIG. 3B is a partial sectional side view of the workpiece and so forth in a cutting position detection step.

In the holding step (S20), first, the valve 28b is set to the close state and the workpiece 11 is placed on the chuck table 26 in such a manner that the side of the back surface 11b of the workpiece 11 is exposed upward. Then, the ring-shaped frame 19 is fixed by the clamp units 26e. In addition, the suction source 28a is operated and the valve 28b is set to the open state. Thereby, the side of the front surface 11a of the workpiece 11 is held by the chuck table 26 with the intermediary of the dicing tape (expanding sheet) 17. After the holding step (S20), the front surface 11a of the workpiece 11 is imaged by the camera unit 50 from the side of the back surface 11b of the workpiece 11 and at least one planned dividing line 15 is detected (cutting position detection step (S30)). FIG. 3B is a partial sectional side view of the workpiece 11 and so forth in the cutting position detection step (S30).

The camera unit 50 in the present embodiment is an infrared camera and therefore can image the side of the front surface 11a with transmission through the substrate 11c. The image obtained by this imaging is stored in the storing device of the control unit. This image includes an alignment mark that exists on the side of the front surface 11a and is called a key pattern or the like. The coordinates of at least one planned dividing line 15 are detected based on the coordinates of this alignment mark. In this manner, the image obtained by the camera unit 50 is used for alignment and so forth of the workpiece 11.

Figure 4A:
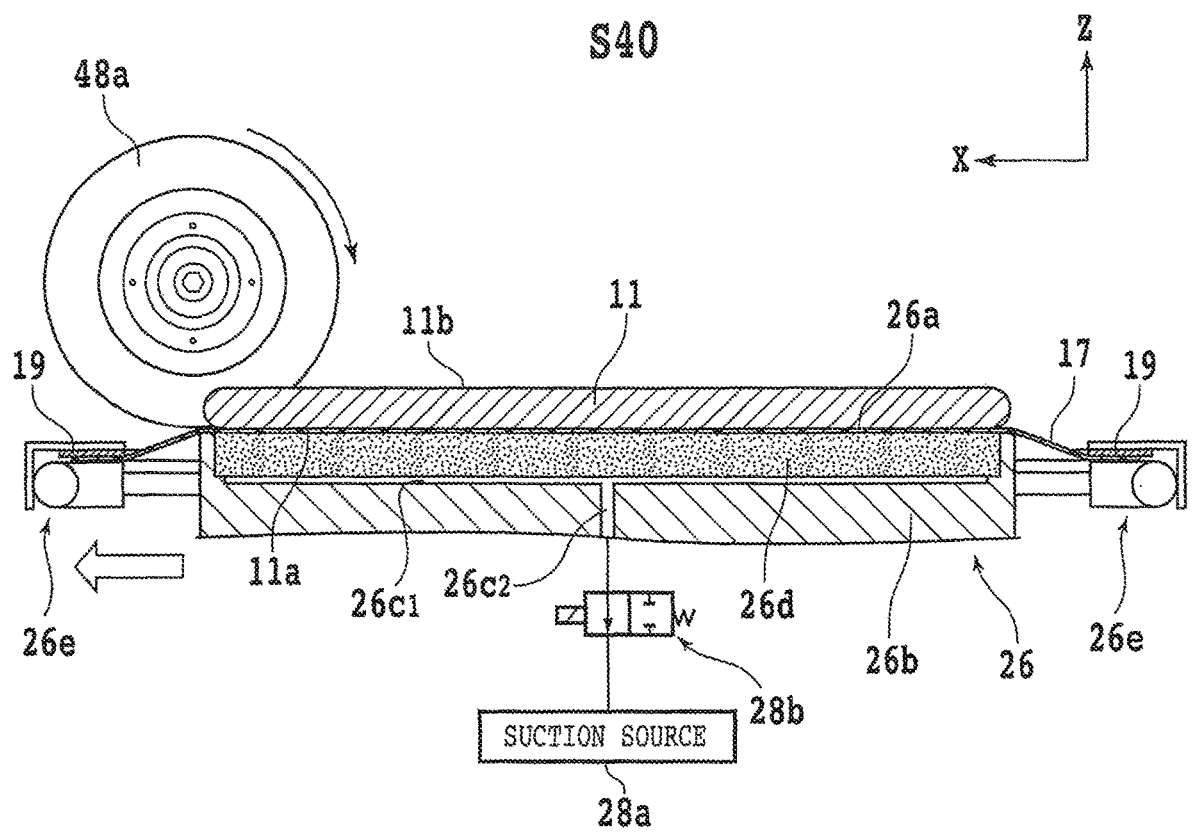
FIG. 4A is a partial sectional side view of the workpiece and so forth in a cutting step.

After the cutting position detection step (S30), the cutting blade 48a is caused to cut into the workpiece 11 in the state in which the side of the front surface 11a is held by the chuck table 26, and a cut groove is formed along each planned dividing line 15 (cutting step (S40)). FIG. 4A is a partial sectional side view of the workpiece 11 and so forth in the cutting step (S40). In the cutting step (S40), first, the chuck table 26 is rotated by using the rotational drive source in such a manner that the planned dividing line 15 becomes parallel to the X-axis direction based on an image obtained by imaging by the camera unit 50. Subsequently, the position of the cutting blade 48a is aligned with the upper side of an extension line of the planned dividing line 15 that is the target of processing by using the Y-axis movement unit 30.

Then, the position of the cutting unit 48 in the Z-axis direction is adjusted in such a manner that the height of the lower end of the cutting blade 48a is set between the front surface 11a and the back surface 11b of the workpiece 11 by using the Z-axis movement unit 40. Thereby, the height of the lower end of the cutting blade 48a is adjusted in such a manner that the cutting-in depth of the cutting blade 48a does not reach the front surface 11a of the workpiece 11. Subsequently, the chuck table 26 is moved in parallel to the X-axis direction relative to the cutting blade 48a by using the X-axis movement unit 10. Thereby, the workpiece 11 is cut along the one planned dividing line 15 and a cut groove is formed on the side of the back surface 11b of the workpiece 11.

After the cut groove is formed along the one planned dividing line 15, indexing feed of the workpiece 11 is carried out by a predetermined indexing amount by using the Y-axis movement unit 30. Then, a cut groove is similarly formed along another planned dividing line 15 adjacent to the cut one planned dividing line 15 in the Y-axis direction. Such operation is repeated until the workpiece 11 is processed along all planned dividing lines 15. Thereby, cut grooves 15a that do not reach the side of the front surface 11a are formed on the side of the back surface 11b along all planned dividing lines 15.

Figure 4B:
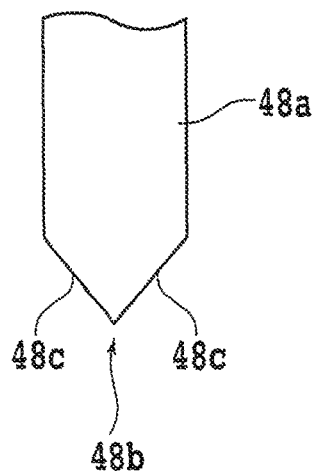
FIG. 4B is a sectional view of a cutting blade before use.

The cutting blade 48a is formed into a circular disc shape (circular ring shape) through mixing abrasive grains of diamond, cubic boron nitride (cBN), or the like with a binder of a metal, ceramic, resin, or the like for example. However, there is no limit to the binder and the abrasive grains that form the cutting blade 48a and the binder and the abrasive grains are selected and changed according to the specification and so forth of the cutting blade 48a. FIG. 4B is a sectional view of the cutting blade 48a before use. As depicted in FIG. 4B, at an outer circumferential part 48b, ring-shaped inclined surfaces 48c are formed from the outer circumferences of the circular-disc-shaped (circular-ring-shaped) end surfaces of the cutting blade 48a to the outer circumference located at substantially the center of the cutting blade 48a in the thickness direction. As above, at the outer circumferential part 48b, the pair of inclined surfaces 48c is formed substantially line-symmetrically with respect to a plane that passes through substantially the center of the cutting blade 48a in the thickness direction and is parallel to the circular-disc-shaped (circular-ring-shaped) end surfaces of the cutting blade 48a.

Figure 4C:
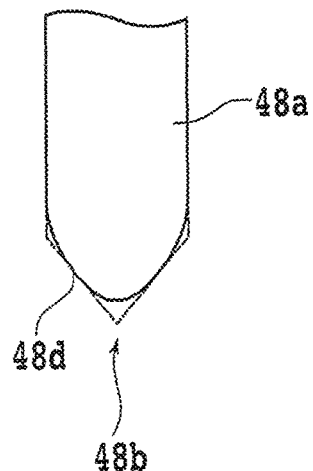
FIG. 4C is a sectional view of the cutting blade after use for a certain time.

When the cutting blade 48a is viewed in a section that passes through the diameter of the cutting blade 48a and is parallel to the thickness direction of the cutting blade 48a, a projection part with a substantially V-shape is formed by the pair of inclined surfaces 48c at the outer circumferential part 48b. When the workpiece 11 is cut by the cutting blade 48a, the cut groove 15a with a substantially V-shape is formed in a sectional view of cutting the workpiece 11 with a plane orthogonal to a straight line parallel to the planned dividing line 15. In the cutting blade 48a after use for a certain time, the corner part has become rounded due to wear. Therefore, at the outer circumferential part 48b, not the pair of inclined surfaces 48c but a curved surface 48d may be formed as depicted in FIG. 4C. FIG. 4C is a sectional view of the cutting blade 48a after use for a certain time. In FIG. 4C, the contour of the outer circumferential part 48b before use is depicted by a dashed line.

As depicted in FIG. 4C, the ring-shaped curved surface 48d that forms a projection shape from the center of the cutting blade 48a toward the outer circumferential side is formed at the outer circumferential part 48b. That is, the contour of the outer circumferential part 48b has a substantially U-shape when the cutting blade 48a is viewed in a section that passes through the diameter of the cutting blade 48*a* and is parallel to the thickness direction of the cutting blade 48*a*. When the workpiece 11 is cut by the cutting blade 48*a*, the cut groove 15*a* with a substantially U-shape is formed in a sectional view of cutting the workpiece 11 with a plane orthogonal to a straight line parallel to the planned dividing line 15.

Figure 5A:
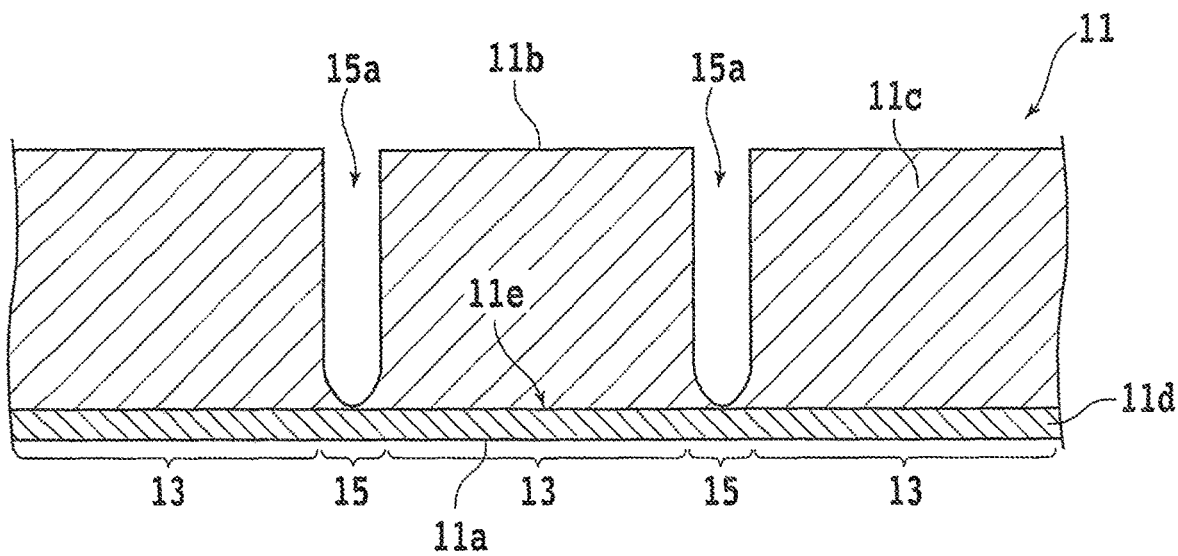
FIG. 5A is a sectional view of part of the workpiece having cut grooves with a first depth.
Figure 5B:
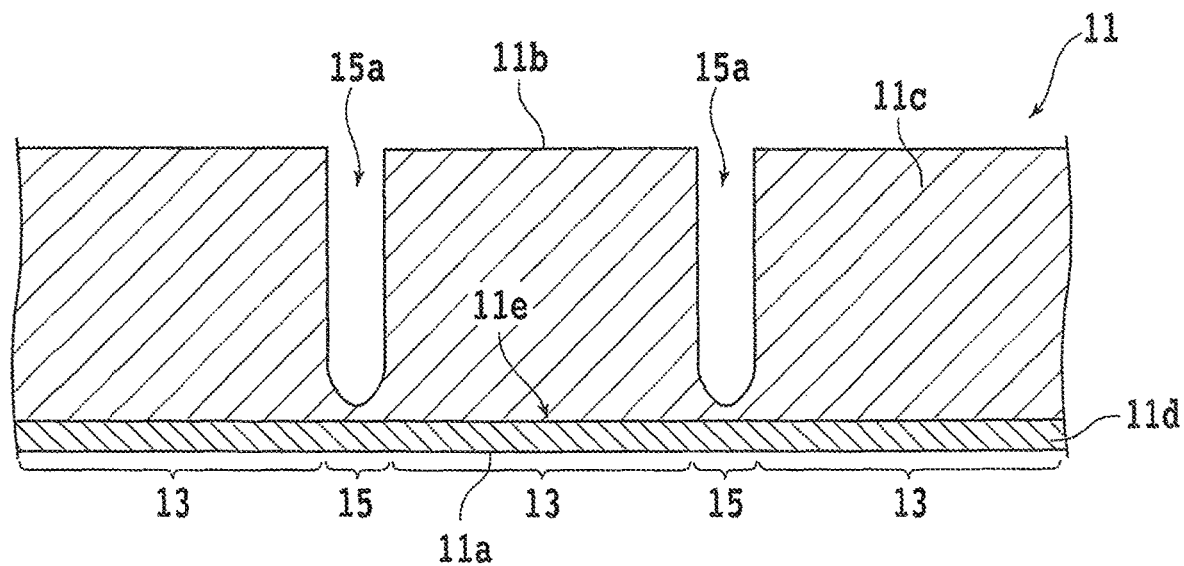
FIG. 5B is a sectional view of part of the workpiece having the cut grooves with a second depth.

In FIG. 5A and FIG. 5B, the cut grooves 15*a* formed in the cutting step (S40) are depicted. FIG. 5A is a sectional view of part of the workpiece 11 having the cut grooves 15*a* with a first depth and FIG. 5B is a sectional view of part of the workpiece 11 having the cut grooves 15*a* with a second depth. In FIG. 5A and FIG. 5B, the case in which the cut grooves 15*a* have a substantially U-shape is depicted and the dicing tape 17 on the side of the front surface 11*a* of the workpiece 11 is omitted. The bottom parts of the cut grooves 15*a* with the first depth depicted in FIG. 5A are located at a boundary 11*e* between the substrate 11*c* and the circuit layer 11*d*. By keeping the circuit layer 11*d* from being cut by the cutting blade 48*a* as above, a delamination phenomenon in which the cutting blade 48*a* cuts the circuit layer 11*d* and the circuit layer 11*d* is removed from the substrate 11*c* can be prevented.

The bottom part of the cut groove 15*a* may be separated from the boundary 11*e* by a predetermined distance. The bottom parts of the cut grooves 15*a* with the second depth depicted in FIG. 5B do not reach the circuit layer 11*d* and are separated from the boundary 11*e* by a predetermined distance of several micrometers to 10 μm inclusive. By separating the bottom parts of the cut grooves 15*a* from the boundary 11*e* by the predetermined distance to make uncut regions of the substrate 11*c* as above, the possibility of cutting of the circuit layer 11*d* by the cutting blade 48*a* can be further decreased compared with the case in which the bottom parts of the cut grooves 15*a* are located at the boundary 11*e*. Therefore, the delamination phenomenon can be prevented more surely.

Moreover, by making the uncut regions of the substrate 11*c*, the mechanical strength of the workpiece 11 at the planned dividing line 15 can be enhanced compared with the case in which the bottom parts of the cut grooves 15*a* are located at the boundary 11*e*. Therefore, it is possible to decrease the possibility of the occurrence of a crack at an unexpected position or in an unexpected direction in the substrate 11*c* in the middle of processing, conveyance, and so forth of the workpiece unit 21. If the substrate 11*c* is formed of silicon, when the distance from the bottom part of the cut groove 15*a* to the boundary 11*e* is set longer than 10 μm, there is a possibility of the occurrence of a crack at an unexpected position or in an unexpected direction in the substrate 11*c*. Thus, it is preferable to set this distance equal to or shorter than 10 μm.

Figure 6A:
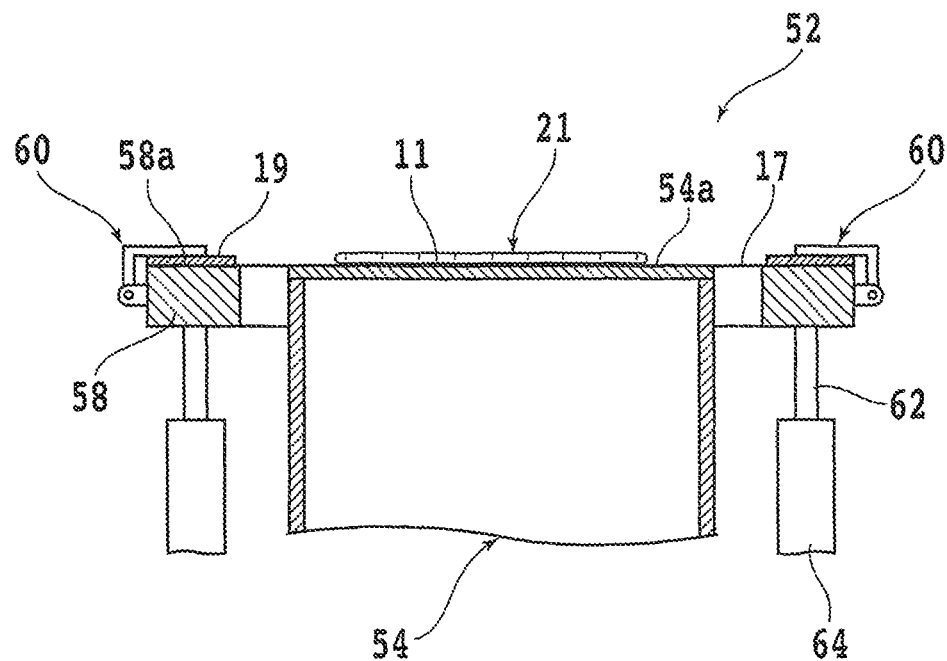
FIG. 6A is a partial sectional side view of a tape expanding apparatus.

After the cutting step (S40), the workpiece 11 is divided along each planned dividing line 15 (dividing step (S50)). In the dividing step (S50), for example, a tape expanding apparatus 52 that expands the dicing tape (expanding sheet) 17 is used. FIG. 6A is a partial sectional side view of the tape expanding apparatus 52. The tape expanding apparatus 52 has a drum 54 that has a diameter larger than the diameter of the workpiece 11 and has a cylindrical shape and a frame holding table 58 that is disposed on the lateral side of the drum 54 and has a circular ring shape.

The upper surface of the frame holding table 58 is a substantially flat placement surface 58*a* on which the ring-shaped frame 19 of the workpiece unit 21 is placed. As depicted in FIG. 6A, when the workpiece unit 21 is placed on the tape expanding apparatus 52, the height positions of the upper surface 54*a* of the drum 54 and the placement surface 58*a* of the frame holding table 58 have been adjusted to become substantially the same. To the outer circumferential side surface of the frame holding table 58, plural clamp units 60 are fixed at different positions in the circumferential direction. Furthermore, the upper end parts of plural piston rods 62 that can move along the height direction of the drum 54 are fixed to the bottom surface of the frame holding table 58. Part of the lower end part side of the piston rod 62 is disposed in an air cylinder 64. When the piston rod 62 is drawn into each air cylinder 64, the upper surface of the frame holding table 58 is lowered relative to the upper surface 54*a* of the drum 54.

Figure 6B:
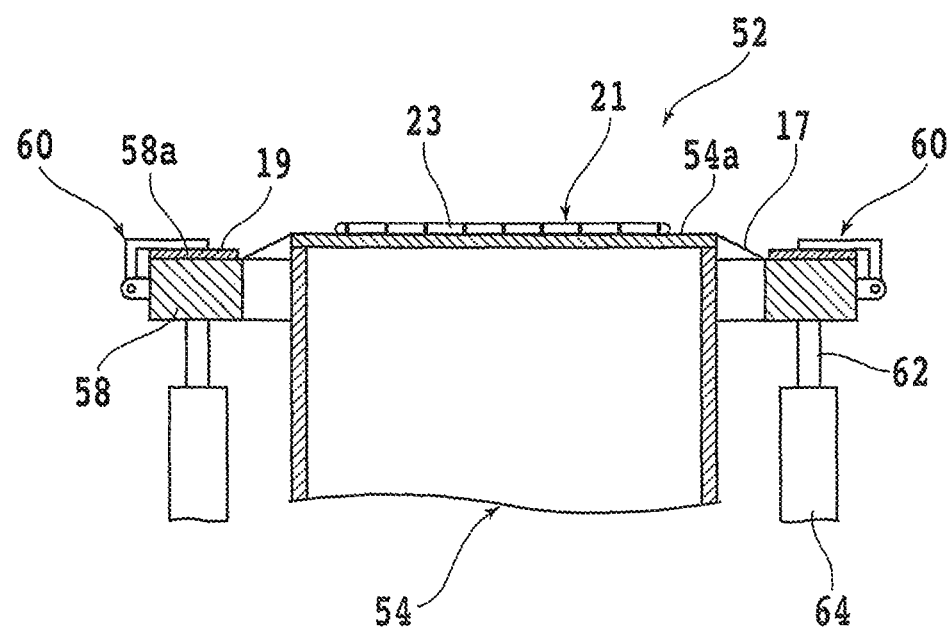
FIG. 6B is a partial sectional side view of the workpiece and so forth in a dividing step.

Next, the dividing step (S50) using the tape expanding apparatus 52 will be described. FIG. 6B is a partial sectional side view of the workpiece 11 and so forth in the dividing step (S50). In the dividing step (S50), first, the workpiece unit 21 is placed on the upper surface 54*a* of the drum 54 and the placement surface 58*a* of the frame holding table 58 adjusted to substantially the same height position. At this time, the part corresponding to the workpiece 11 in the workpiece unit 21 is placed on the upper surface 54*a* and the part corresponding to the ring-shaped frame 19 in the workpiece unit 21 is placed on the placement surface 58*a*. Then, the position of the ring-shaped frame 19 is fixed by the clamp units 60.

Subsequently, the air cylinders 64 are actuated and the frame holding table 58 is lowered relative to the upper surface 54*a*. Thereby, as depicted in FIG. 6B, the dicing tape (expanding sheet) 17 is expanded in a radial manner from the center of the circular dicing tape 17 and the workpiece 11 is divided along each planned dividing line 15. Specifically, in the dividing step (S50), with the bottom parts of the cut grooves 15*a* with a V-shape or U-shape being the points of origin, cracks extend between the bottom parts of the cut grooves 15*a* and the front surface 11*a*, and the uncut regions of substrate 11*c* and the circuit layer 11*d* directly under the uncut regions are broken. Thereby, plural chips 23 are formed from the workpiece 11. The width of the cracks formed in the front surface 11*a* at the time of breakage is at a degree less than even 1 μm. For this reason, the kerf width of the front surface 11*a* can be made smaller than the case of cutting the front surface 11*a* by the cutting blade 48*a*. Therefore, in the manufacturing method of the chips 23 in the present embodiment, the width of the planned dividing lines 15 can be set smaller than the case of cutting the front surface 11*a* by the cutting blade 48*a*.

Figure 7:
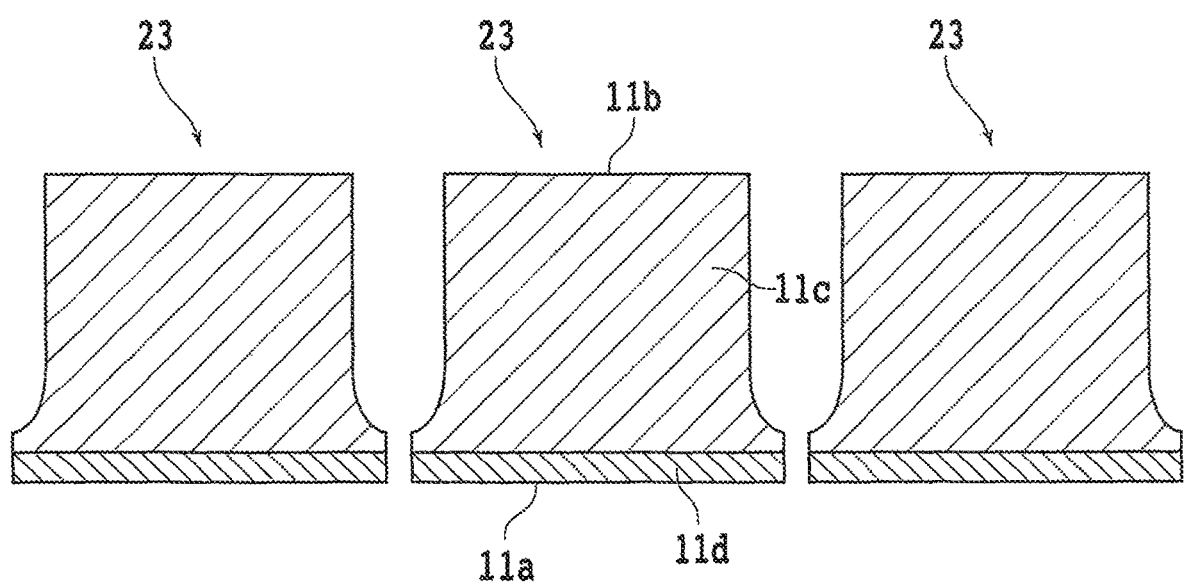
FIG. 7 is a sectional view of plural chips.

FIG. 7 is a sectional view of plural chips 23. In FIG. 7, a sectional view of plural chips 23 when the cut grooves 15*a* with the second depth are formed in the workpiece 11 (see FIG. 5B) is depicted and the dicing tape 17 on the side of the front surface 11*a* of the workpiece 11 is omitted. After the dividing step (S50), the side of the front surface 11*a* of each chip 23 is irradiated with ultraviolet and the adhesion force of the adhesion layer of the dicing tape 17 is lowered. Thereafter, suction of the side of the back surface 11*b* of the chip 23 is made by a suction head of an inversion pick-up apparatus (not depicted) and the chip 23 is picked up.

Subsequently, the suction head is turned upside down such that the side of the front surface 11*a* of the chip 23 may be oriented upward. At this time, the chip 23 becomes the state in which the lower side is supported by the suction head of the inversion pick-up apparatus. Thereafter, suction of the side of the front surface 11*a* of the chip 23 to a suction head of a bonding apparatus (not depicted) is made for example. Thereby, the chip 23 is passed from the inversion pick-up apparatus to the bonding apparatus. In the case of conveying the chip 23, the inversion pick-up apparatus does not necessarily need to be used. For example, after the dividing step (S50), an adhesion tape (not depicted) for transfer of the chip 23 is stuck to the side of the back surface 11b of each chip 23 and the side of the front surface 11a is irradiated with ultraviolet to remove the dicing tape 17 from the workpiece unit 21. Thereby, each chip 23 is transferred to the adhesion tape. In this case, without using the inversion pick-up apparatus, for example the suction head of the bonding apparatus (not depicted) can make suction of the side of the front surface 11a of the chip 23 to pick up and convey the chip 23.

Figure 8:
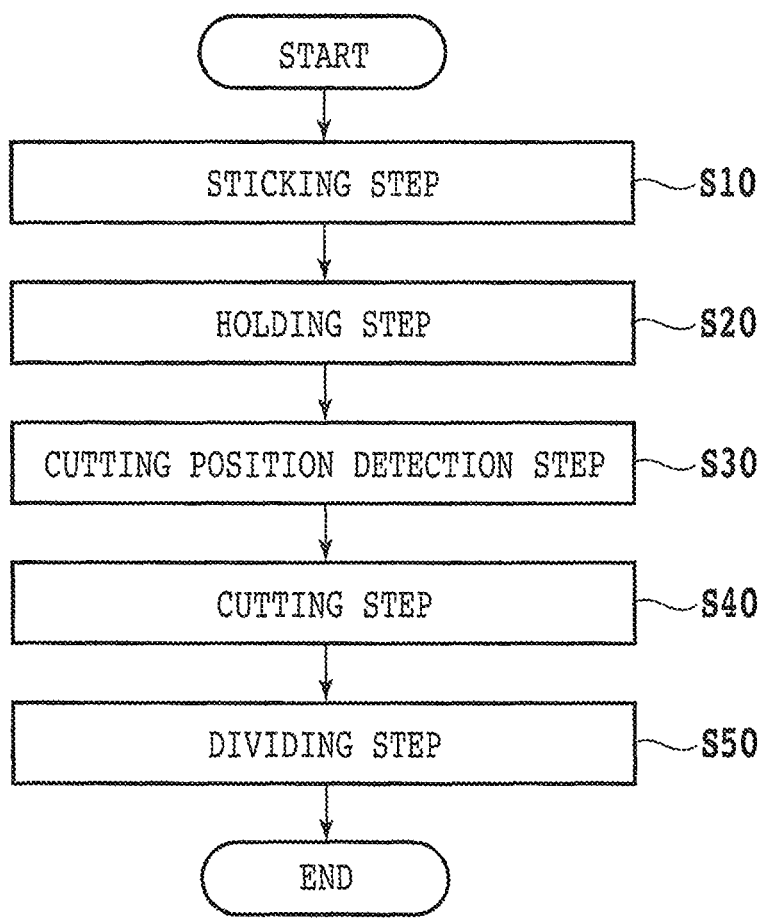
FIG. 8 is a flowchart of a manufacturing method of chips in a first embodiment.

FIG. 8 is a flowchart of the manufacturing method of the chips 23 in the first embodiment. The workpiece 11 is divided without cutting the front surface 11a of the workpiece 11 in the cutting step (S40) in the first embodiment. Therefore, the kerf width of the side of the front surface 11a can be made smaller than the case of cutting the workpiece 11 from the front surface 11a to the back surface 11b to break the workpiece 11. For this reason, the width of the planned dividing lines 15 can be made small. Incidentally, in the above-described dividing step (S50), another kind of a tape expanding apparatus (not depicted) that pulls the dicing tape (expanding sheet) 17 outward from four sides may be used instead of the tape expanding apparatus 52 that expands the dicing tape 17 in a radial manner.

Figure 10A:
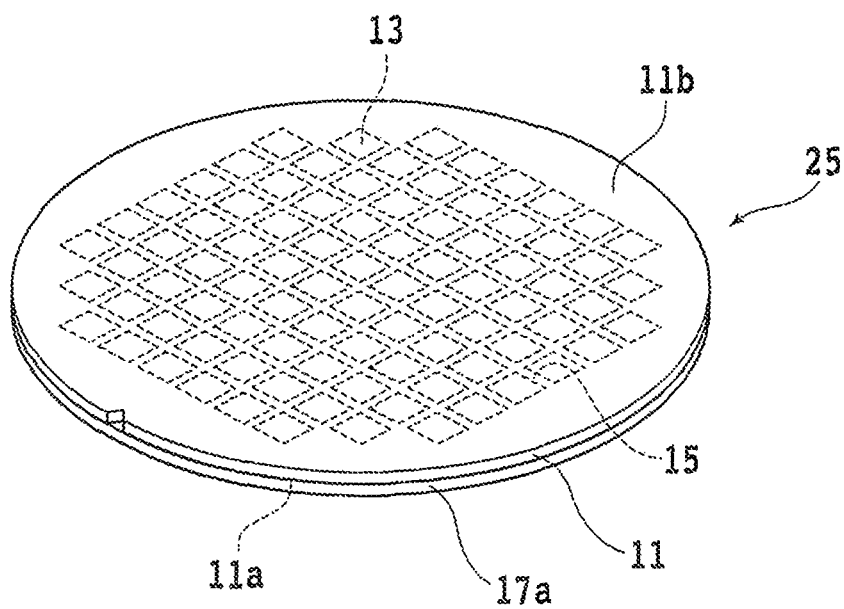
FIG. 10A is a perspective view of a stacked-layer body including the workpiece.
Figure 10B:
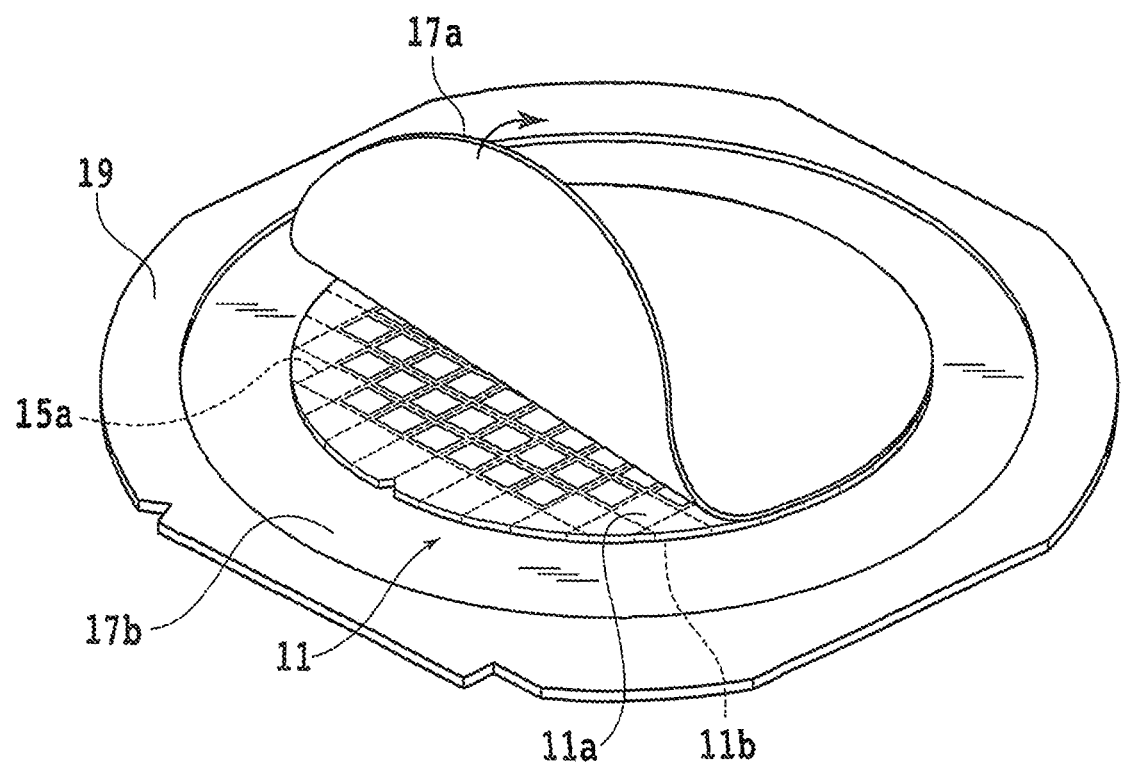
FIG. 10B is a perspective view depicting how a front surface protective tape is removed from the workpiece.

Next, a second embodiment will be described by using FIG. 9, FIG. 10A, and FIG. 10B. FIG. 9 is a flowchart of a manufacturing method of the chips 23 in the second embodiment. In the second embodiment, first, a front surface protective tape 17a as a front surface protective member is stuck to the side of the front surface 11a of the workpiece 11 (front surface protection step (S15)). Instead of the front surface protective tape 17a, a substrate formed of a component having rigidity may be used as the front surface protective member. Thereby, a stacked-layer body 25 composed of the front surface protective tape 17a and the workpiece 11 is formed. FIG. 10A is a perspective view of the stacked-layer body 25 including the workpiece 11. The ring-shaped frame 19 is not stuck to the front surface protective tape 17a in the present embodiment. However, when the front surface protective tape 17a has a diameter larger than the diameter of the workpiece 11, the ring-shaped frame 19 may be stuck to the outer circumferential part of the front surface protective tape 17a.

The front surface protective tape 17a is a film that is made of a resin and is obtained by stacking a base layer made of the resin through which ultraviolet can be transmitted and an ultraviolet-curable adhesion layer for example. The front surface protective tape 17a in the second embodiment has such expandability as to be easily deformed in response to a tensile stress. However, the front surface protective tape 17a does not necessarily need to have expandability. After the front surface protection step (S15), the holding step (S20), the cutting position detection step (S30), and the cutting step (S40) are carried out similarly to the first embodiment. In the cutting step (S40), the cut grooves 15a that do not reach the side of the front surface 11a are formed on the side of the back surface 11b. After the front surface protection step (S15), processing of back surface grinding or the like may be carried out for the workpiece 11.

Then, after the cutting step (S40), a sticking step (S45) is carried out. In the sticking step (S45), first, the stacked-layer body 25 is disposed in the opening part of the ring-shaped frame 19 and an expanding sheet 17b is stuck to the side of the back surface 11b of the workpiece 11 and one surface of the ring-shaped frame 19. The expanding sheet 17b is a film that is obtained by stacking a base layer and an adhesion layer. The expanding sheet 17b is made of a resin and has expandability. Furthermore, the adhesion layer of the expanding sheet 17b is an ultraviolet-curable resin for example. In the sticking step (S45), subsequently, the side of the front surface 11a of the workpiece 11 is irradiated with ultraviolet. The ultraviolet is transmitted through the base layer of the front surface protective tape 17a and reaches the adhesion layer. This lowers the adhesion force of the front surface protective tape 17a.

Thereafter, the front surface protective tape 17a is removed by using a removing apparatus (not depicted). FIG. 10B is a perspective view depicting how the front surface protective tape 17a is removed from the workpiece 11. By removing the front surface protective tape 17a, a workpiece unit composed of the workpiece 11, the expanding sheet 17b, and the ring-shaped frame 19 is formed. After the sticking step (S45), the workpiece 11 is divided into plural chips 23 along the planned dividing lines 15 by using the above-described tape expanding apparatus 52 (dividing step (S50)). Thereafter, the side of the back surface 11b of each chip 23 is irradiated with ultraviolet and the adhesion force of the adhesion layer of the expanding sheet 17b is lowered.

In the second embodiment, without using the inversion pick-up apparatus (not depicted), the adhesion tape (not depicted) for transfer, and so forth as in the first embodiment, a suction head of a bonding apparatus (not depicted) or the like can make suction of the side of the front surface 11a of each chip 23 and pick up each chip 23 to convey each chip 23. Needless to say, also in the cutting step (S40) in the second embodiment, the workpiece 11 is divided without cutting the front surface 11a of the workpiece 11. Therefore, the kerf width of the side of the front surface 11a can be made smaller than the case of cutting the workpiece 11 from the front surface 11a to the back surface 11b to break the workpiece 11. For this reason, the width of the planned dividing lines 15 can be made small.

Figure 11:
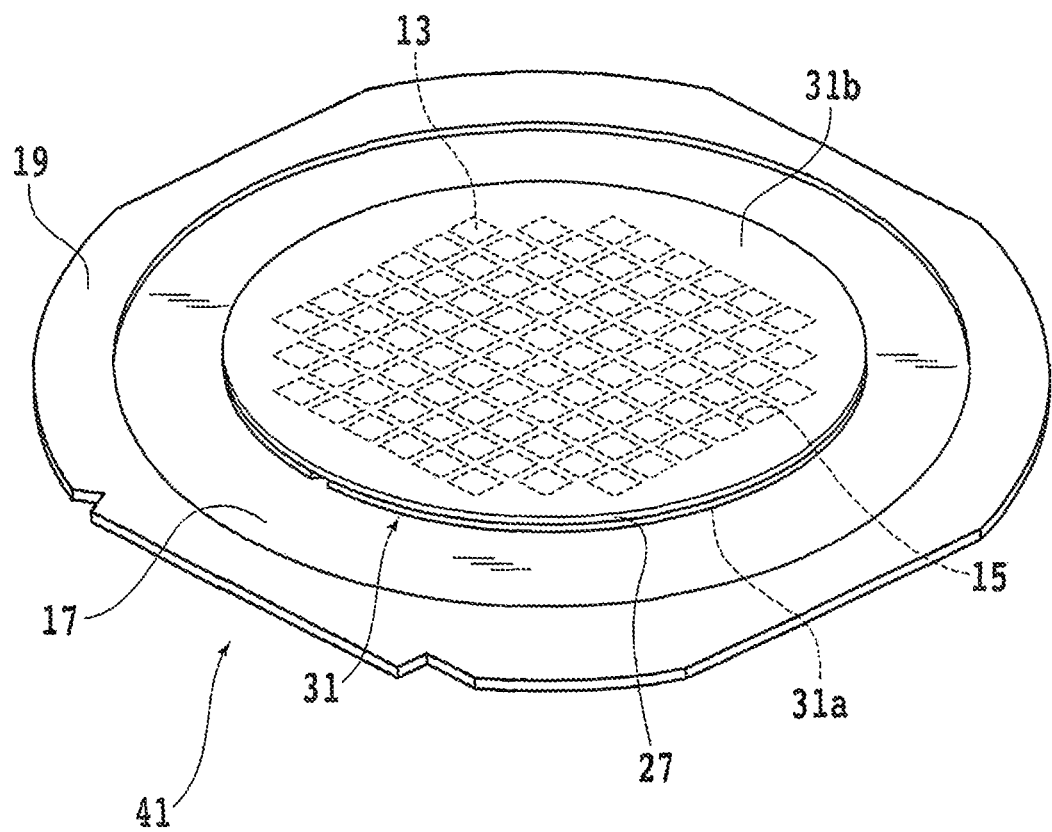
FIG. 11 is a perspective view of a workpiece unit according to a third embodiment.

Next, a third embodiment will be described. In the third embodiment, a workpiece 31 on which a metal layer 27 is formed on the side of a back surface 31b is divided along the planned dividing lines 15 to form plural chips 23. FIG. 11 is a perspective view of a workpiece unit 41 according to the third embodiment. The workpiece 31 is a wafer that has a substantially circular disc shape and includes a front surface 31a and a back surface 31b. The workpiece 31 has a substrate 31c (see FIG. 15) formed of silicon carbide (SiC). On the side of the front surface 31a of the workpiece 31, the above-described circuit layer 11d (see FIG. 15) is formed in contact with the substrate 31c.

The side of the front surface 31a of the workpiece 31 is segmented into plural regions by plural planned dividing lines (streets) 15 arranged in a lattice manner to intersect each other. A device 13 such as power semiconductor device exists in each of the plural regions and each device 13 is composed of the substrate 31c and the circuit layer 11d. The metal layer 27 is disposed on one surface of the substrate 31c located on the side of the back surface 31b of the workpiece 31. The metal layer 27 is a stacked-layer body obtained by stacking a titanium (Ti) layer in contact with the substrate 31c and a nickel (Ni) layer located on the opposite side to the substrate 31c across the titanium layer for example.

However, the material that forms the stacked-layer body is not limited to the titanium layer and the nickel layer. Furthermore, the metal layer 27 may be a layer of a single metal material or may be a stacked-layer body obtained by stacking metal layers of three or more different materials. The side of the front surface 31a of the workpiece 31 is fixed at the opening part of the ring-shaped frame 19 through the dicing tape (expanding sheet) 17. The dicing tape 17 is a film that is obtained by stacking a base layer and an adhesion layer. The dicing tape 17 is made of a resin and has expandability. Because the metal layer 27 is formed on the whole of the side of the back surface 31b of the workpiece 31, it is impossible to image the planned dividing line 15 on the side of the front surface 31a when the side of the back surface 31b is imaged by an infrared camera. Thus, in the third embodiment, a cutting apparatus 72 that can image the side of the front surface 31a from the lower side through the dicing tape 17 is used.

Figure 12:
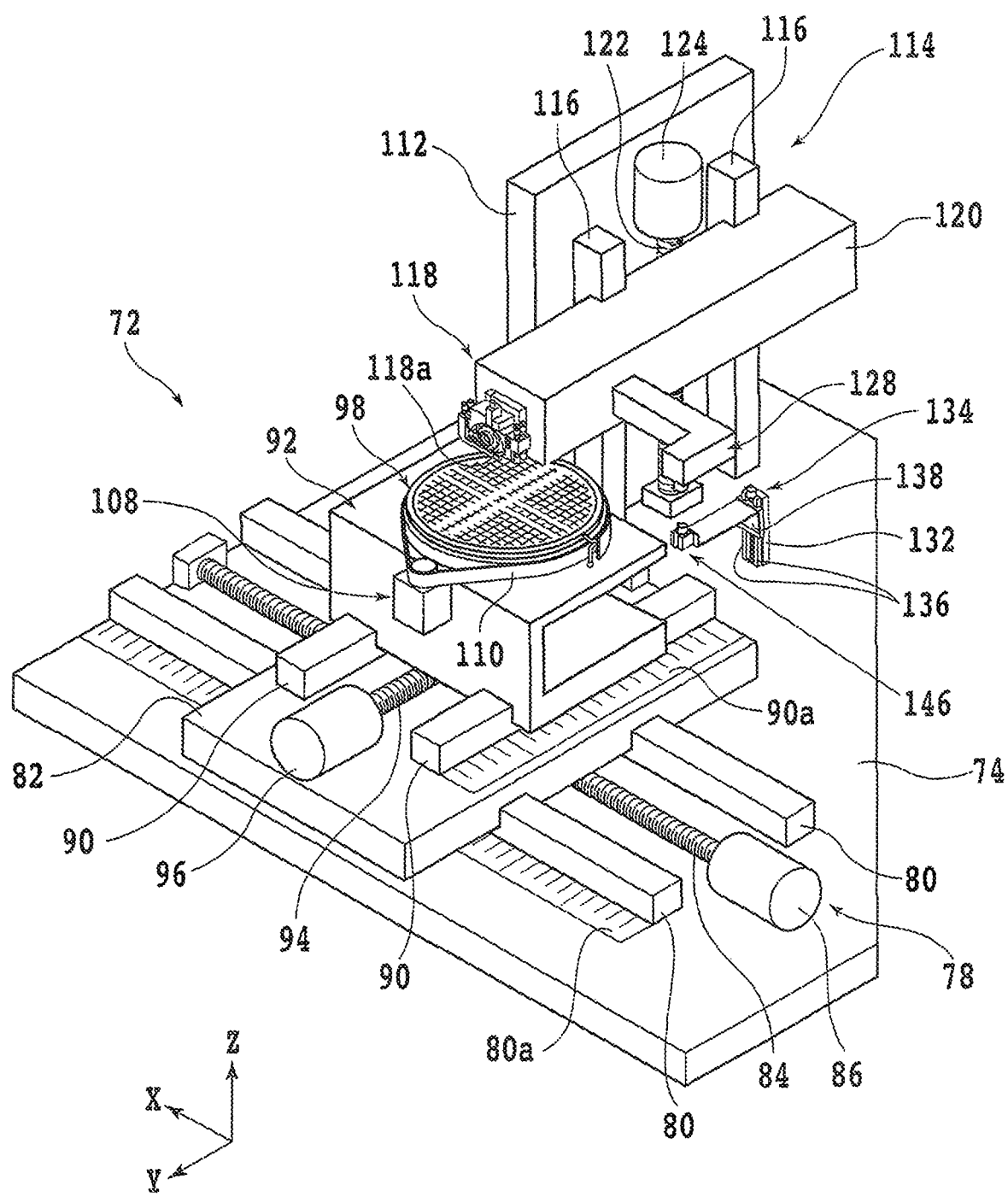
FIG. 12 is a perspective view of a cutting apparatus in the third embodiment.

FIG. 12 is a perspective view of the cutting apparatus 72 in the third embodiment. The cutting apparatus 72 includes a base 74 that supports the respective constituent elements. An X-axis-Y-axis movement mechanism (processing feed-and-indexing feed mechanism) 78 is disposed on the upper surface of the base 74. The X-axis-Y-axis movement mechanism 78 includes a pair of X-axis guide rails 80 that is substantially parallel to the X-axis direction. The X-axis guide rails 80 are fixed to the upper surface of the base 74.

An X-axis movement table 82 is slidably attached to the X-axis guide rails 80. A nut part (not depicted) is disposed on the lower surface side of the X-axis movement table 82 and an X-axis ball screw 84 substantially parallel to the X-axis guide rails 80 is joined to this nut part in a rotatable form. An X-axis pulse motor 86 is coupled to one end part of the X-axis ball screw 84. When the X-axis ball screw 84 is rotated by the X-axis pulse motor 86, the X-axis movement table 82 moves in the X-axis direction along the X-axis guide rails 80. An X-axis scale 80a used when the position of the X-axis movement table 82 in the X-axis direction is detected is disposed at a position adjacent to the X-axis guide rail 80.

Figure 13:
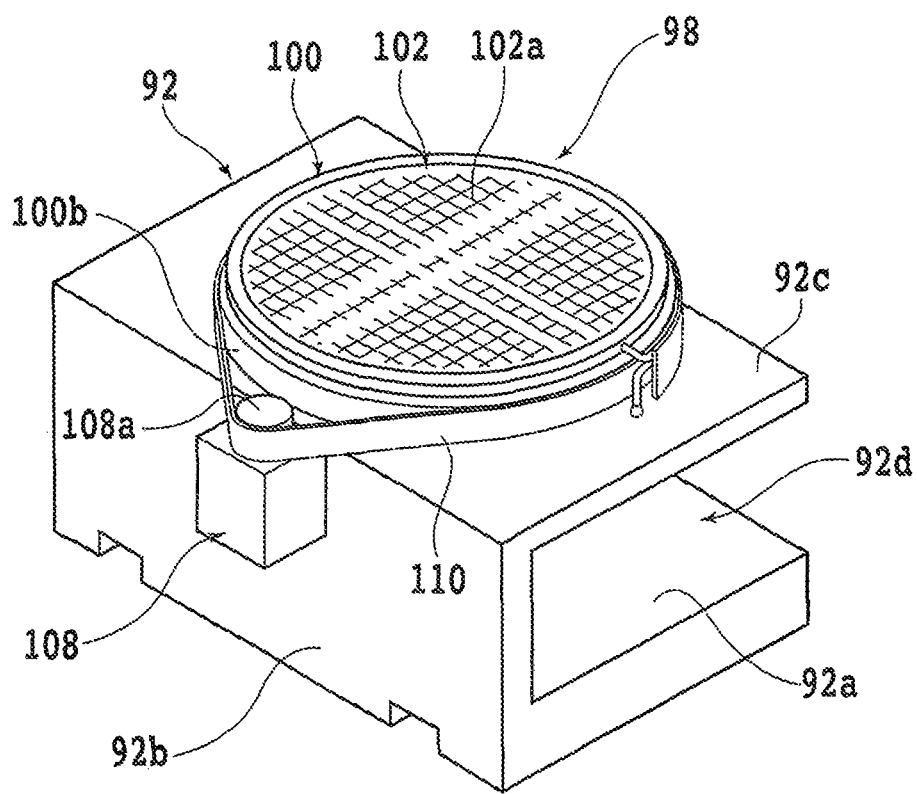
FIG. 13 is a perspective view of a Y-axis movement table and so forth.
Figure 14A:
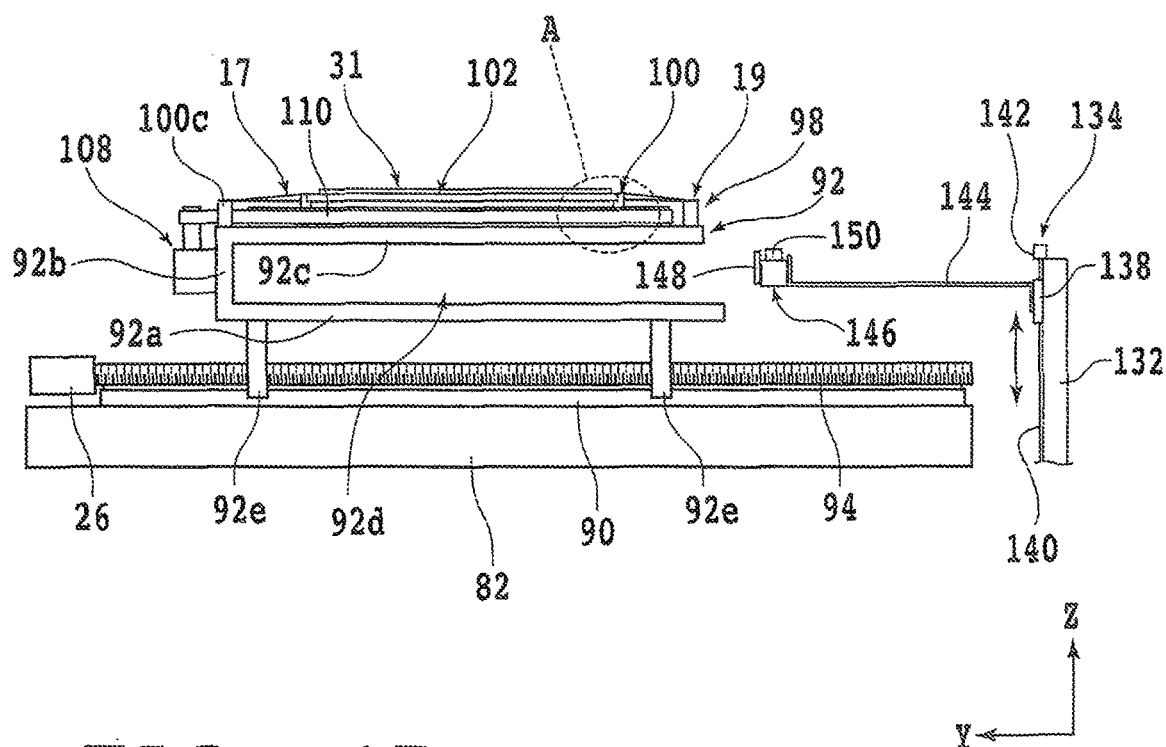
FIG. 14A is a sectional view of part of the cutting apparatus.
Figure 14B:
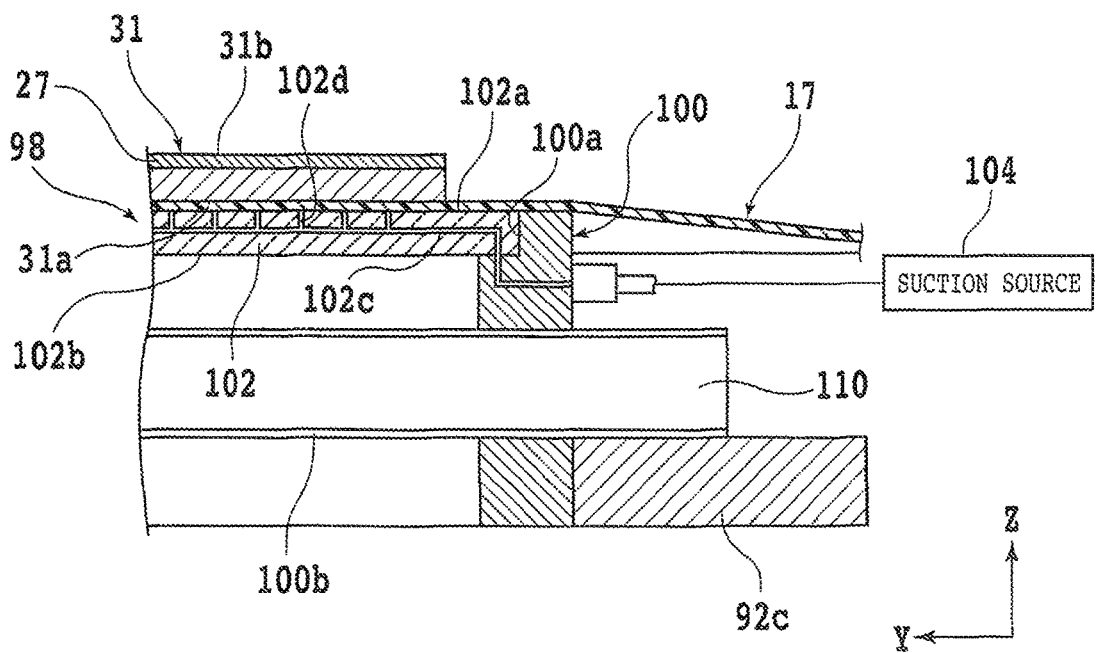
FIG. 14B is a sectional view in which region A in FIG. 14A is enlarged.

A pair of Y-axis guide rails 90 substantially parallel to the Y-axis direction is fixed to the upper surface of the X-axis movement table 82. A Y-axis movement table 92 is slidably attached to the Y-axis guide rails 90. FIG. 13 is a perspective view of the Y-axis movement table 92 and so forth. FIG. 14A is a sectional view of part of the cutting apparatus 72. FIG. 14B is a sectional view obtained by enlarging region A in FIG. 14A. In FIG. 14A and FIG. 14B, the workpiece 31 and so forth processed by the cutting apparatus 72 are depicted in conjunction. Furthermore, hatching of sections is omitted in FIG. 14A. As depicted in FIG. 12, FIG. 13, and FIG. 14A, the Y-axis movement table 92 includes a bottom plate part 92a whose shape viewed in the Z-axis direction is a rectangle.

To one end of the bottom plate part 92a in the Y-axis direction, the lower end of a side plate part 92b whose shape viewed in the Y-axis direction is a rectangle is connected. To the upper end of the side plate part 92b, one end, in the Y-axis direction, of a top plate part 92c whose shape viewed in the Z-axis direction is a rectangle similar to that of the bottom plate part 92a is connected. That is, a space 92d that leads to the external at the other end in the Y-axis direction and both ends in the X-axis direction is formed between the bottom plate part 92a and the top plate part 92c. Nut parts 92e (FIG. 14A) are disposed on the lower surface side of the bottom plate part 92a of the Y-axis movement table 92 and a Y-axis ball screw 94 substantially parallel to the Y-axis guide rails 90 is joined to the nut parts 92e in a rotatable form. A Y-axis pulse motor 96 is coupled to one end part of the Y-axis ball screw 94.

When the Y-axis ball screw 94 is rotated by the Y-axis pulse motor 96, the Y-axis movement table 92 moves in the Y-axis direction along the Y-axis guide rails 90. A Y-axis scale 90a (see FIG. 12) used when the position of the Y-axis movement table 92 in the Y-axis direction is detected is disposed at a position adjacent to the Y-axis guide rail 90. A chuck table (holding table) 98 used when the plate-shaped workpiece 31 (see FIG. 14A and FIG. 14B) is held is disposed on the upper surface side of the top plate part 92c of the Y-axis movement table 92. The chuck table 98 is supported by the top plate part 92c in the form of being rotatable around a rotation axis substantially parallel to the Z-axis direction.

The chuck table 98 includes a frame body 100 that is formed of a metal material such as stainless steel and has a cylindrical shape for example. At the upper part of the frame body 100, a holding member 102 with a circular disc shape is disposed to close an opening part 100a on the upper part side of the frame body 100. The holding member 102 has a substantially flat front surface (holding surface) 102a and a back surface 102b on the opposite side to the front surface 102a and is composed of a transparent material through which visible light is transmitted, such as soda glass, borosilicate glass, or quartz glass. As depicted in FIG. 14B, a suction path 102c used for suction of the workpiece 31 is made inside the holding member 102. Furthermore, plural openings 102d equivalent to one end of the suction path 102c are formed in the front surface 102a of the holding member 102. The plural openings 102d are disposed at substantially equal intervals in the front surface 102a. A suction source 104 including an ejector or the like is connected to the other end side of the suction path 102c.

The holding member 102 is transparent to visible light from the front surface 102a to the back surface 102b in at least a partial region excluding the suction path 102c and the openings 102d. Therefore, the workpiece 31 or the like disposed on the side of the front surface 102a of the holding member 102 can be imaged from the side of the back surface 102b of the holding member 102 by a camera 150 for visible light. In the present embodiment, the holding member 102 wholly composed of a transparent material transparent to visible light is depicted. However, it suffices that at least part of the holding member 102 is transparent from the front surface 102a to the back surface 102b.

A rotational drive source 108 such as a motor is disposed on the side plate part 92b of the Y-axis movement table 92. A belt 110 for transmitting power of the rotational drive source 108 is stretched on a pulley part 100b disposed on the outer circumference of the frame body 100 and a pulley 108a coupled to a rotating shaft of the rotational drive source 108. Therefore, the chuck table 98 can rotate around a rotation axis substantially parallel to the Z-axis direction by power transmitted from the rotational drive source 108 through the belt 110. On the outer circumference of the frame body 100, plural clamps 100c used when the ring-shaped frame 19 is fixed are disposed besides the pulley part 100b (see FIG. 14A). The plural clamps 100c are fixed to the frame body 100 in such a form as not to inhibit rotation of the chuck table 98. Furthermore, the chuck table 98 can move together with the X-axis movement table 82 and the Y-axis movement table 92 in the X-axis direction and the Y-axis direction by the above-described X-axis-Y-axis movement mechanism 78.

As depicted in FIG. 12, a support structure 112 with a column shape or wall shape is disposed in a region that does not overlap with the X-axis-Y-axis movement mechanism 78 in the upper surface of the base 74. A Z-axis movement mechanism 114 is disposed on a side surface of the support structure 112. The Z-axis movement mechanism 114 includes a pair of Z-axis guide rails 116 that is fixed to the side surface of the support structure 112 and is substantially parallel to the Z-axis direction. A spindle housing 120 that configures a cutting unit 118 is slidably attached to the Z-axis guide rails 116. A nut part (not depicted) is disposed on the side surface of the spindle housing 120 on the side of the support structure 112 and a Z-axis ball screw 122 substantially parallel to the Z-axis guide rails 116 is joined to this nut part in a rotatable form.

A Z-axis pulse motor 124 is coupled to one end part of the Z-axis ball screw 122. When the Z-axis ball screw 122 is rotated by the Z-axis pulse motor 124, the spindle housing 120 moves in the Z-axis direction along the Z-axis guide rails 116. A Z-axis scale (not depicted) used when the position of the spindle housing 120 in the Z-axis direction is detected is disposed at a position adjacent to the Z-axis guide rail 116. The cutting unit 118 includes a spindle (not depicted) that serves as a rotation axis parallel to the Y-axis direction. The spindle is supported in the above-described spindle housing 120 in a rotatable form. One end part of the spindle is exposed from the spindle housing 120. A cutting blade 118a with a circular ring shape is mounted to this one end part of the spindle. Meanwhile, a rotational drive source (not depicted) such as a motor is coupled to the other end side of the spindle.

An upper imaging unit 128 for imaging the workpiece 31 or the like held by the chuck table 98 from the upper side is fixed to the spindle housing 120 of the cutting unit 118. Thus, the upper imaging unit 128 is fixed to the spindle housing 120 and moves together with the cutting unit 118 in the Z-axis direction by the Z-axis movement mechanism 114. An imaging unit support structure 132 with a column shape or wall shape is disposed in a region that is separated from the X-axis-Y-axis movement mechanism 78 in the Y-axis direction and is under the spindle housing 120 in the upper surface of the base 74. An imaging unit movement mechanism 134 is disposed on a side surface of the imaging unit support structure 132.

The imaging unit movement mechanism 134 includes a pair of Z-axis guide rails 136 that is fixed to the side surface of the imaging unit support structure 132 and is substantially parallel to the Z-axis direction. A Z-axis movement plate 138 is slidably attached to the Z-axis guide rails 136. A nut part (not depicted) is disposed on the side surface of the Z-axis movement plate 138 on the side of the imaging unit support structure 132 and a Z-axis ball screw 140 substantially parallel to the Z-axis guide rails 136 is joined to this nut part in a rotatable form (see FIG. 14A).

A Z-axis pulse motor 142 is coupled to one end part of the Z-axis ball screw 140. When the Z-axis ball screw 140 is rotated by the Z-axis pulse motor 142, the Z-axis movement plate 138 moves in the Z-axis direction along the Z-axis guide rails 136. A Z-axis scale (not depicted) used when the position of the Z-axis movement plate 138 in the Z-axis direction is detected is disposed at a position adjacent to the Z-axis guide rail 136. A lower imaging unit 146 is fixed to the Z-axis movement plate 138 with the intermediary of a support arm 144 that is long in the Y-axis direction. The lower imaging unit 146 includes an illuminating apparatus 148 that irradiates a subject (in the present embodiment, workpiece 31) with visible light and the camera 150 for visible light including an imaging element that receives light reflected from the subject and forms an image.

A control unit (not depicted) is connected to constituent elements such as the X-axis-Y-axis movement mechanism 78, the rotational drive source 108, the Z-axis movement mechanism 114, the cutting unit 118, the upper imaging unit 128, the imaging unit movement mechanism 134, and the lower imaging unit 146. The control unit controls operation of each constituent element such that the workpiece 31 may be properly processed. The control unit is configured by a computer including a processing device such as a CPU and a storing device such as a flash memory. The processing device is caused to operate in accordance with software such as a program stored in the storing device and thereby the control unit functions as specific means in which the software and the processing device (hardware resources) cooperate.

Next, the processing procedure of the workpiece 31 according to a third embodiment will be described. In the third embodiment, the workpiece 31 is processed in the same procedure as the flowchart of the first embodiment depicted in FIG. 8. First, the workpiece unit 41 depicted in FIG. 11 is formed (sticking step (S10)). After the sticking step (S10), the holding step (S20) is carried out similarly to the first embodiment. In the holding step (S20), first, the workpiece unit 41 is placed on the chuck table 98 in such a manner that the dicing tape 17 gets contact with the front surface 102a of the holding member 102. Then, the ring-shaped frame 19 is fixed by the clamps 100c. In addition, a negative pressure of the suction source 104 is caused to act from the plural openings 102d equivalent to one end of the suction path 102c. Thereby, the workpiece 31 is held by the chuck table 98 in the state in which the side of the back surface 11b is exposed upward.

After the holding step (S20), the cutting position detection step (S30) is carried out. In the cutting position detection step (S30), operation of the X-axis-Y-axis movement mechanism 78 and the imaging unit movement mechanism 134 is controlled and the lower imaging unit 146 is disposed below the transparent region of the holding member 102. That is, the lower imaging unit 146 is inserted into the space 92d between the bottom plate part 92a and the top plate part 92c of the Y-axis movement table 92. The position of the lower imaging unit 146 relative to the holding member 102 is arbitrarily adjusted in a range suitable for imaging of the workpiece 31.

As described above, part of the holding member 102 is transparent. Therefore, the side of the front surface 31a of the workpiece 31 can be imaged when visible light is emitted from the illuminating apparatus 148 of the lower imaging unit 146 toward the workpiece 31 on the upper side and light reflected from the side of the front surface 31a of the workpiece 31 through the holding member 102 and the dicing tape 17 is received by the imaging element of the camera 150 for visible light. The image obtained by this imaging is stored in the storing device of the control unit. This image includes an alignment mark such as a key pattern that exists on the side of the front surface 31a of the workpiece 31. The coordinates of at least one planned dividing line 15 are detected based on the coordinates of the alignment mark. In this manner, the image obtained by the camera 150 for visible light is used for alignment and so forth of the workpiece 31.

After the cutting position detection step (S30), the cutting step (S40) is carried out. In the cutting step (S40), operation of the X-axis-Y-axis movement mechanism 78 is controlled and the position of the cutting blade 118a is aligned with the upper side of an extension line of the planned dividing line 15 that is the target of processing. Then, operation of the Z-axis movement mechanism 114 is controlled and the position of the cutting unit 118 in the Z-axis direction is adjusted in such a manner that the height of the lower end of the cutting blade 118a is set between the front surface 31a and the back surface 31b of the workpiece 31.

Thereafter, while the cutting blade 118a is rotated, the chuck table 98 is moved in the X-axis direction by the X-axis-Y-axis movement mechanism 78. Thereby, the cutting blade 118a is caused to cut into the workpiece 31 from the side of the back surface 31b of the workpiece 31 along the planned dividing line 15 that is the target of processing and the workpiece 31 is processed along the planned dividing line 15. After the cut groove 15a is formed along the one planned dividing line 15, indexing feed of the workpiece 31 is carried out by a predetermined indexing amount by using the X-axis-Y-axis movement mechanism 78. Then, the cut groove 15a is similarly formed along another planned dividing line 15 adjacent to the cut one planned dividing line 15 in the Y-axis direction. Such operation is repeated until the workpiece 31 is processed along all planned dividing lines 15. Thereby, the cut grooves 15a that do not reach the side of the front surface 31a are formed on the side of the back surface 31b along all planned dividing lines 15.

Figure 15:
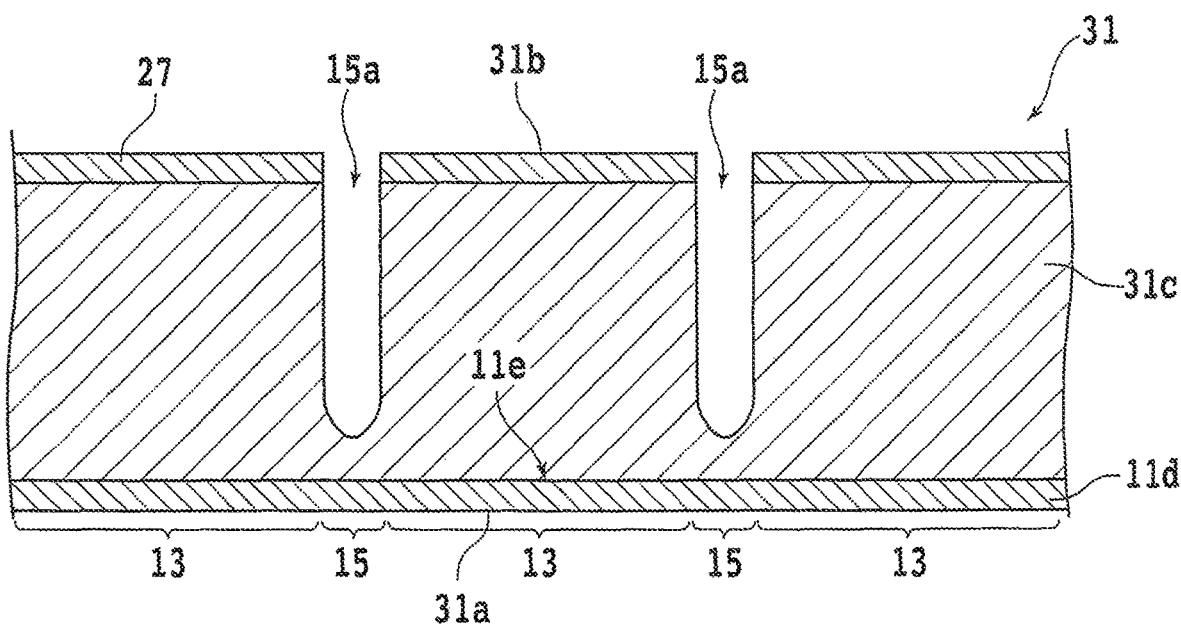
FIG. 15 is a sectional view of part of a workpiece having the cut grooves with a third depth.

FIG. 15 is a sectional view of part of the workpiece 31 having the cut grooves 15a with a third depth. In FIG. 15, the case in which the cut grooves 15a have a substantially U-shape is depicted and the dicing tape 17 on the side of the front surface 31a of the workpiece 31 is omitted. The bottom parts of the cut grooves 15a with the third depth depicted in FIG. 15 do not reach the circuit layer 11d and are separated from the boundary 11e between the substrate 31c and the circuit layer 11d by a predetermined distance. The bottom parts of the cut grooves 15a with the third depth are more separated from the boundary 11e than the bottom parts of the cut grooves 15a with the above-described second depth. The bottom parts of the cut grooves 15a with the third depth are separated from the boundary 11e by the predetermined distance of several micrometers to 30 μm inclusive, preferably by the predetermined distance that is longer than 10 μm and is equal to or shorter than 30 μm.

By separating the bottom parts of the cut grooves 15a from the boundary 11e by the predetermined distance to make uncut regions in the substrate 31c, the possibility of cutting of the circuit layer 11d by the cutting blade 118a can be further decreased compared with the case in which the bottom parts of the cut grooves 15a are located at the boundary 11e. Therefore, the delamination phenomenon can be prevented more surely. Moreover, by making the uncut regions, the mechanical strength of the workpiece 31 at the planned dividing line 15 can be enhanced compared with the case in which the bottom parts of the cut grooves 15a are located at the boundary 11e. Therefore, it is possible to decrease the possibility of the occurrence of a crack at an unexpected position or in an unexpected direction in the substrate 31c in the middle of processing, conveyance, and so forth of the workpiece unit 41.

After the cutting step (S40), the negative pressure of the suction source 104 is blocked and the fixing of the ring-shaped frame 19 by the clamps 100c is released. Then, the workpiece unit 41 is carried out from the chuck table 98 to the above-described tape expanding apparatus 52. Thereafter, the dividing step (S50) is carried out. In the dividing step (S50), the workpiece 31 is divided into plural chips 23 by expanding the dicing tape (expanding sheet) 17 by using the above-described tape expanding apparatus 52. The substrate 31c in the third embodiment is formed of SiC, which has higher hardness than silicon. However, the present inventor has confirmed that there is no obstacle to the dividing of the workpiece 31 in the dividing step (S50) even when the amount of uncut part is set larger than the first embodiment.

After the dividing step (S50), the side of the front surface 31a of each chip 23 is irradiated with ultraviolet and the adhesion force of the adhesion layer of the dicing tape 17 is lowered. Thereafter, a suction head of an inversion pick-up apparatus (not depicted) makes suction of the side of the back surface 31b of the chip 23 and passes the side of the front surface 31a of the chip 23 to a suction head of a bonding apparatus (not depicted).

Instead of this, after the dividing step (S50), an adhesion tape (not depicted) for transfer of the chip 23 may be stuck to the side of the back surface 31b of each chip 23 and the side of the front surface 31a may be irradiated with ultraviolet to remove the dicing tape 17. Thereby, each chip 23 is transferred to the adhesion tape. In this case, the suction head of the bonding apparatus (not depicted) can make suction of the side of the front surface 31a of the chip 23 to pick up and convey the chip 23. Also in the cutting step (S40) in the third embodiment, the workpiece 31 is divided without cutting the front surface 31a of the workpiece 31. Therefore, the kerf width of the side of the front surface 31a can be made smaller than the case of cutting the workpiece 31 from the front surface 31a to the back surface 31b to break the workpiece 31. For this reason, the width of the planned dividing lines 15 can be made small.

Figure 16A:
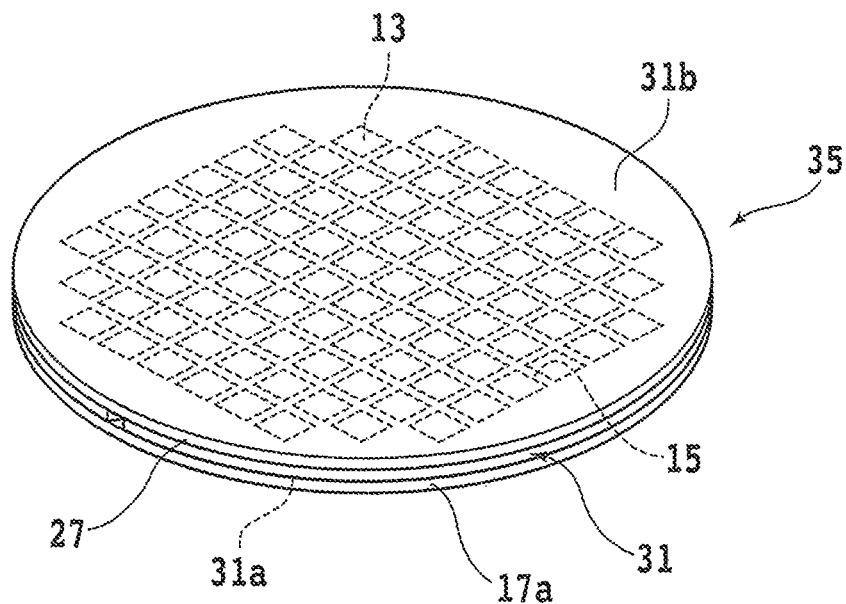
FIG. 16A is a perspective view of a stacked-layer body including the workpiece.

Next, a fourth embodiment will be described. In the fourth embodiment, the workpiece 31 having the metal layer 27 is processed in the same procedure as the flowchart of the second embodiment depicted in FIG. 9. First, the front surface protective tape 17a is stuck to the side of the front surface 31a of the workpiece 31 (front surface protection step (S15)). Thereby, a stacked-layer body 35 composed of the front surface protective tape 17a and the workpiece 31 is formed. FIG. 16A is a perspective view of the stacked-layer body 35 including the workpiece 31. The ring-shaped frame 19 is not stuck to the front surface protective tape 17a in the present embodiment. However, when the front surface protective tape 17a has a diameter larger than the diameter of the workpiece 31, the ring-shaped frame 19 may be stuck to the outer circumferential part of the front surface protective tape 17a.

After the front surface protection step (S15), the holding step (S20), the cutting position detection step (S30), and the cutting step (S40) are carried out. In the cutting step (S40), the cut grooves 15a that do not reach the side of the front surface 31a are formed on the side of the back surface 31b. Then, after the cutting step (S40), the sticking step (S45) is carried out. In the sticking step (S45), the stacked-layer body 35 is disposed in the opening part of the ring-shaped frame 19 and the expanding sheet 17b is stuck to the side of the back surface 31b of the workpiece 31 and one surface of the ring-shaped frame 19.

Figure 16B:
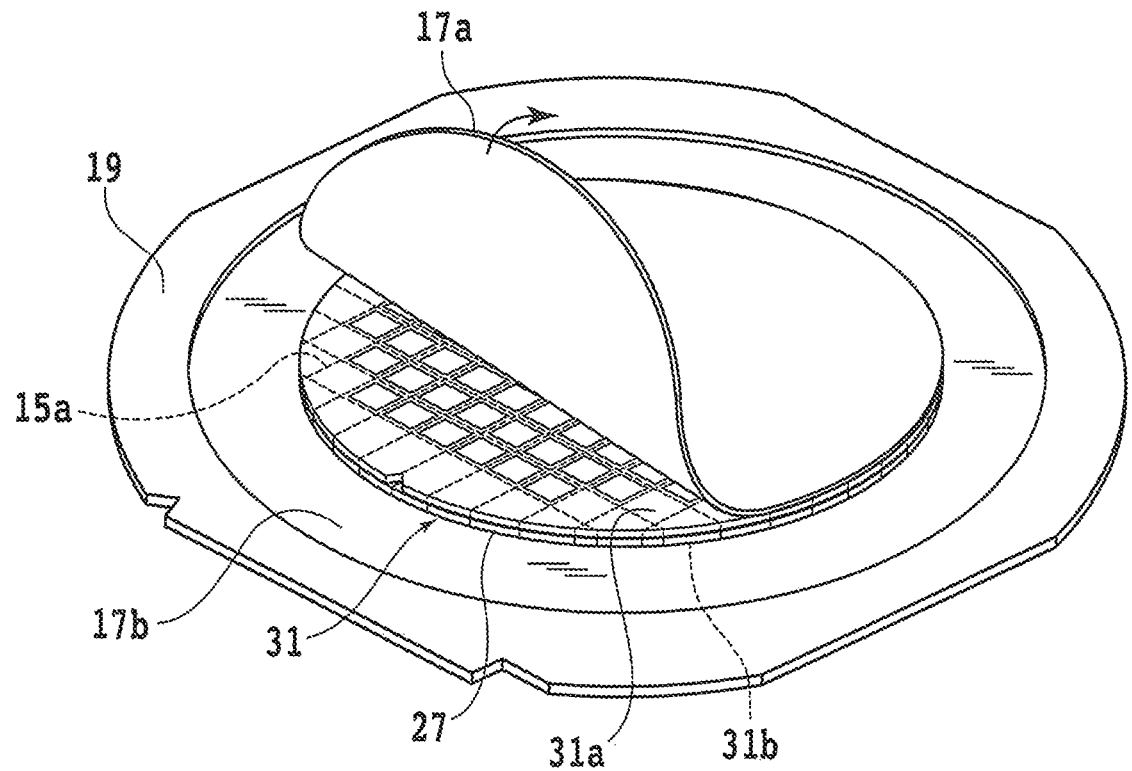
FIG. 16B is a perspective view depicting how the front surface protective tape is removed from the workpiece.

Moreover, after the side of the front surface 31a of the workpiece 31 is irradiated with ultraviolet, the front surface protective tape 17a is removed by using a removing apparatus (not depicted). FIG. 16B is a perspective view depicting how the front surface protective tape 17a is removed from the workpiece 31. By removing the front surface protective tape 17a, a workpiece unit composed of the workpiece 31, the expanding sheet 17b, and the ring-shaped frame 19 is formed. After the sticking step (S45), the workpiece 31 is divided into plural chips 23 along the planned dividing lines 15 by using the above-described tape expanding apparatus 52 (dividing step (S50)). Thereafter, the side of the back surface 31b of each chip 23 is irradiated with ultraviolet and the adhesion force of the adhesion layer of the expanding sheet 17b is lowered.

In the fourth embodiment, without using the inversion pick-up apparatus (not depicted), the adhesion tape (not depicted) for transfer, and so forth as in the third embodiment, suction of the side of the front surface 31a of each chip 23 can be made and each chip 23 can be picked up by a pick-up apparatus (not depicted), so that each chip 23 can be conveyed. Needless to say, also in the cutting step (S40) in the fourth embodiment, the workpiece 31 is divided without cutting the front surface 31a of the workpiece 31. Therefore, the kerf width of the side of the front surface 31a can be made smaller than the case of cutting the workpiece 31 from the front surface 31a to the back surface 31b to break the workpiece 31. For this reason, the width of the planned dividing lines 15 can be made small.

Besides, structures, methods, and so forth according to the above-described embodiments can be implemented with appropriate changes without departing from the range of the object of the present invention. For example, also in each dividing step (S50) in the second embodiment, the third embodiment, and the fourth embodiment, another kind of a tape expanding apparatus (not depicted) that pulls the dicing tape 17 outward from four sides may be used.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A manufacturing method of chips in which a workpiece including a plurality of planned dividing lines on a front surface is divided along each planned dividing line to manufacture the chips from the workpiece, the manufacturing method of chips comprising:
    a cutting step of causing a cutting blade to cut into the workpiece for which a side of the front surface of the workpiece is held by a holding table in such a manner that a side of a back surface of the workpiece is exposed and forming a cut groove that does not reach the front surface of the workpiece on the side of the back surface of the workpiece along each planned dividing line;
    a sticking step of sticking an expanding sheet to the workpiece; and
    a dividing step of dividing the workpiece along each planned dividing line by expanding the expanding sheet to form the chips from the workpiece after the sticking step and the cutting step, and
    wherein:
        in the dividing step, a crack extends between a bottom part of the cut groove and the front surface of the workpiece, not with a modified layer inside the workpiece being a point of origin, but with the bottom part of the cut groove being a point of origin.

2. The manufacturing method of chips according to claim 1, further comprising:
    a cutting position detection step of imaging the front surface of the workpiece by an infrared camera from the side of the back surface of the workpiece and detecting at least one planned dividing line before the cutting step.

3. The manufacturing method of chips according to claim 1, the holding table having a holding member that is at least partly transparent from a front surface of the holding member to a back surface of the holding member, the manufacturing method of chips further comprising:
    a cutting position detection step of imaging the front surface of the workpiece by a camera for visible light through the holding member and detecting at least one planned dividing line before the cutting step.

4. The manufacturing method of chips according to claim 3, wherein:
    the workpiece includes a silicon carbide substrate and a metal layer that is disposed on one surface of the silicon carbide substrate and is located on the side of the back surface of the workpiece, and
    the cutting blade is caused to cut into the workpiece from the side of the back surface of the workpiece to form the cut grooves in the cutting step.

5. The manufacturing method of chips according to claim 1, wherein:
    the sticking step is carried out before the cutting step,
    the expanding sheet is stuck to the side of the front surface of the workpiece in the sticking step, and
    the cut grooves are formed in the workpiece in a state in which the side of the front surface of the workpiece is held by the holding table with intermediary of the expanding sheet in the cutting step.

6. The manufacturing method of chips according to claim 1, wherein:
    the sticking step is carried out after the cutting step, and
    the expanding sheet is stuck to the side of the back surface of the workpiece in the sticking step.

7. The manufacturing method of chips according to claim 1, wherein:
    the cutting blade has a pair of inclined surfaces or a curved surface at an outer circumferential part, and
    the workpiece is cut by the cutting blade in the cutting step.

8. The manufacturing method of chips according to claim 1, wherein:
    the workpiece has a circuit layer including insulating layers and interconnect layers that are alternately stacked on the side of the front surface, and
    the cut grooves that do not reach the circuit layer are formed in the workpiece in the cutting step.

9. The manufacturing method of chips according to claim 8, wherein during the dividing step, the circuit layer is broken along each planned dividing line.

10. The manufacturing method of chips according to claim 1, wherein the bottom part of the cut groove has a V-shape.

11. The manufacturing method of chips according to claim 1, wherein the bottom part of the cut groove has a U-shape.

12. The manufacturing method of chips according to claim 1, wherein a distance between a base of each of said cut grooves and the circuit layer is between 3 μm and 10 μm.

* * * * *